United States Patent
Marakhtanov et al.

(10) Patent No.: US 9,536,749 B2
(45) Date of Patent: Jan. 3, 2017

(54) ION ENERGY CONTROL BY RF PULSE SHAPE

(71) Applicant: Lam Research Corporation, Fremont, CA (US)

(72) Inventors: Alexei Marakhtanov, Albany, CA (US); Zhigang Chen, Campbell, CA (US); John Patrick Holland, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 14/570,859

(22) Filed: Dec. 15, 2014

(65) Prior Publication Data
US 2016/0172216 A1 Jun. 16, 2016

(51) Int. Cl.
*H01L 21/3065* (2006.01)
*H01L 21/67* (2006.01)
*H01J 37/32* (2006.01)

(52) U.S. Cl.
CPC ..... *H01L 21/3065* (2013.01); *H01J 37/32082* (2013.01); *H01J 37/32146* (2013.01); *H01J 37/32174* (2013.01); *H01J 37/32183* (2013.01); *H01L 21/67069* (2013.01)

(58) Field of Classification Search
None
See application file for complete search history.

(56) References Cited

U.S. PATENT DOCUMENTS

| 4,353,777 A | 10/1982 | Jacob |
| 4,377,961 A | 3/1983 | Bode |
| 4,420,790 A | 12/1983 | Golke et al. |
| 4,454,001 A | 6/1984 | Stemheim et al. |
| 4,457,820 A | 7/1984 | Bergeron et al. |

(Continued)

FOREIGN PATENT DOCUMENTS

| CN | 101110347 | 1/2008 |
| JP | 2001-127045 A | 5/2001 |

(Continued)

OTHER PUBLICATIONS

Electromagnetic Waves and Antennas, Sophocles J. Orfanidis, Rutgers University, Aug. 25, 2013, Chapter 10.10.

(Continued)

*Primary Examiner* — Jiong-Ping Lu
(74) *Attorney, Agent, or Firm* — Martine Penilla Group, LLP

(57) ABSTRACT

A method for slope control of ion energy is described. The method includes receiving a setting indicating that an etch operation is to be performed using a radio frequency (RF) pulse signal. The RF pulse signal includes a first state and a second state. The first state has a higher power level than the second state. The method further includes receiving a pulse slope associated with the RF pulse signal. The pulse slope provides a transition between the first state and the second state. Also, the pulse slope is other than substantially infinite for reducing an amount of ion energy during the etch operation. The method includes determining power levels and timings for achieving the pulse slope and sending the power levels and the timings to an RF generator to generate the RF pulse signal.

21 Claims, 24 Drawing Sheets

(56) References Cited

U.S. PATENT DOCUMENTS

| | | |
|---|---|---|
| 4,500,563 A | 2/1985 | Ellenberger et al. |
| 5,474,648 A | 12/1995 | Patrick et al. |
| 5,479,340 A | 12/1995 | Fox et al. |
| 5,556,549 A | 9/1996 | Patrick et al. |
| 5,571,366 A | 11/1996 | Ishii et al. |
| 5,689,215 A | 11/1997 | Richardson et al. |
| 5,694,207 A | 12/1997 | Hung et al. |
| 5,737,177 A | 4/1998 | Mett et al. |
| 5,764,471 A | 6/1998 | Burkhart |
| 5,788,801 A | 8/1998 | Barbee et al. |
| 5,810,963 A | 9/1998 | Tomioka |
| 5,812,361 A | 9/1998 | Jones et al. |
| 5,866,985 A | 2/1999 | Coultas et al. |
| 5,889,252 A | 3/1999 | Williams et al. |
| 5,892,198 A | 4/1999 | Barnes et al. |
| 5,894,400 A | 4/1999 | Graven et al. |
| 5,980,767 A | 11/1999 | Koshimizu et al. |
| 5,989,999 A | 11/1999 | Levine et al. |
| 6,020,794 A | 2/2000 | Wilbur |
| 6,021,672 A | 2/2000 | Lee |
| 6,042,686 A | 3/2000 | Dible et al. |
| 6,048,435 A | 4/2000 | DeOrnellas et al. |
| 6,110,214 A | 8/2000 | Klimasauskas |
| 6,157,867 A | 12/2000 | Hwang et al. |
| 6,198,616 B1 | 3/2001 | Dahimene et al. |
| 6,246,972 B1 | 6/2001 | Klimasauskas |
| 6,441,555 B1 | 8/2002 | Howald et al. |
| 6,472,822 B1 | 10/2002 | Chen et al. |
| 6,522,121 B2 | 2/2003 | Coumou |
| 6,535,785 B2 | 3/2003 | Johnson et al. |
| 6,597,002 B1 | 7/2003 | Kondo |
| 6,669,783 B2 | 12/2003 | Sexton et al. |
| 6,677,246 B2 | 1/2004 | Scanlan et al. |
| 6,750,711 B2 | 6/2004 | Chawla et al. |
| 6,781,317 B1 | 8/2004 | Goodman |
| 6,823,815 B2 | 11/2004 | Han et al. |
| 6,838,635 B2 | 1/2005 | Hoffman et al. |
| 6,862,557 B2 | 3/2005 | Jones et al. |
| 6,873,114 B2 | 3/2005 | Avoyan et al. |
| 6,972,524 B1 | 12/2005 | Marakhtanov et al. |
| 6,983,215 B2 | 1/2006 | Coumou et al. |
| 7,042,311 B1 | 5/2006 | Hilliker et al. |
| 7,122,965 B2 | 10/2006 | Goodman |
| 7,169,625 B2 | 1/2007 | Davis et al. |
| 7,323,116 B2 | 1/2008 | Guiney et al. |
| 7,359,177 B2 | 4/2008 | Yang et al. |
| 7,361,287 B2 | 4/2008 | Laermer |
| 7,375,038 B2 | 5/2008 | Kumar |
| 7,435,926 B2 | 10/2008 | Jafarian-Tehrani |
| 7,459,100 B2 | 12/2008 | Kiermasz et al. |
| 7,480,571 B2 | 1/2009 | Howald et al. |
| 7,505,879 B2 | 3/2009 | Tomoyasu et al. |
| 7,586,100 B2 | 9/2009 | Raj et al. |
| 7,728,602 B2 | 6/2010 | Valcore et al. |
| 7,764,140 B2 | 7/2010 | Nagarkatti et al. |
| 7,768,269 B2 | 8/2010 | Piptone et al. |
| 7,858,898 B2 | 12/2010 | Bailey, III et al. |
| 7,967,944 B2 | 6/2011 | Shannon et al. |
| 8,040,068 B2 | 10/2011 | Coumou et al. |
| 8,053,991 B2 | 11/2011 | Kim et al. |
| 8,080,168 B2 | 12/2011 | Cirigliano |
| 8,080,760 B2 | 12/2011 | Dhindsa et al. |
| 8,103,492 B2 | 1/2012 | Brcka |
| 8,264,238 B1 | 9/2012 | El-Chouelry |
| 8,271,121 B2 | 9/2012 | Venugopal et al. |
| 8,368,308 B2 | 2/2013 | Banna et al. |
| 8,404,598 B2 | 3/2013 | Liao et al. |
| 8,501,631 B2 | 8/2013 | Valcore et al. |
| 8,679,358 B2 | 3/2014 | Nakagawa |
| 8,901,935 B2 | 12/2014 | Valcore et al. |
| 2003/0082835 A1 | 5/2003 | McChesney et al. |
| 2003/0103793 A1 | 6/2003 | Murakoshi et al. |
| 2003/0119308 A1 | 6/2003 | Geefay et al. |
| 2004/0028837 A1 | 2/2004 | Fink |
| 2004/0045506 A1 | 3/2004 | Chen et al. |
| 2004/0060660 A1 | 4/2004 | Klimecky et al. |
| 2004/0061448 A1 | 4/2004 | Avoyan et al. |
| 2004/0087047 A1 | 5/2004 | Jaiswal et al. |
| 2004/0107906 A1 | 6/2004 | Collins et al. |
| 2004/0135590 A1 | 7/2004 | Quon |
| 2004/0222184 A1 | 11/2004 | Hayami et al. |
| 2004/0226657 A1 | 11/2004 | Hoffman |
| 2005/0057165 A1 | 3/2005 | Goodman |
| 2005/0090118 A1 | 4/2005 | Shannon et al. |
| 2005/0133163 A1 | 6/2005 | Shannon et al. |
| 2005/0134186 A1 | 6/2005 | Brouk et al. |
| 2005/0151479 A1 | 7/2005 | Avoyan et al. |
| 2005/0205532 A1 | 9/2005 | Patrick et al. |
| 2005/0217797 A1 | 10/2005 | Jafarian-Tehrani |
| 2005/0241762 A1 | 11/2005 | Paterson et al. |
| 2005/0252884 A1 | 11/2005 | Lam et al. |
| 2006/0054596 A1 | 3/2006 | Howard |
| 2006/0065623 A1 | 3/2006 | Guiney et al. |
| 2006/0065631 A1 | 3/2006 | Cheng et al. |
| 2006/0065632 A1 | 3/2006 | Cheng et al. |
| 2006/0088655 A1 | 4/2006 | Collins et al. |
| 2006/0100824 A1 | 5/2006 | Moriya |
| 2006/0169582 A1 | 8/2006 | Brown et al. |
| 2006/0231526 A1 | 10/2006 | Donohue |
| 2006/0232471 A1 | 10/2006 | Coumou |
| 2007/0021935 A1 | 1/2007 | Larson et al. |
| 2007/0065594 A1 | 3/2007 | Chiang et al. |
| 2007/0095788 A1 | 5/2007 | Hoffman et al. |
| 2007/0127188 A1 | 6/2007 | Yang et al. |
| 2007/0247074 A1 | 10/2007 | Paterson et al. |
| 2007/0252580 A1 | 11/2007 | Dine et al. |
| 2007/0262723 A1 | 11/2007 | Ikenouchi |
| 2008/0241016 A1 | 10/2008 | Kato et al. |
| 2009/0151871 A1 | 6/2009 | Pease et al. |
| 2009/0255800 A1* | 10/2009 | Koshimizu ....... H01J 37/32165 204/164 |
| 2009/0284156 A1 | 11/2009 | Banna et al. |
| 2009/0294061 A1 | 12/2009 | Shannon et al. |
| 2009/0295296 A1 | 12/2009 | Shannon et al. |
| 2009/0308734 A1 | 12/2009 | Krauss |
| 2010/0099266 A1 | 4/2010 | Oswald et al. |
| 2010/0136793 A1 | 6/2010 | Chen et al. |
| 2010/0248488 A1 | 9/2010 | Agarwal et al. |
| 2010/0270141 A1 | 10/2010 | Carter et al. |
| 2010/0332201 A1 | 12/2010 | Albarede et al. |
| 2011/0031216 A1 | 2/2011 | Liao et al. |
| 2011/0097901 A1 | 4/2011 | Banna et al. |
| 2011/0115492 A1 | 5/2011 | Valcore, Jr. et al. |
| 2011/0118863 A1 | 5/2011 | Valcore, Jr. |
| 2012/0000887 A1 | 1/2012 | Eto et al. |
| 2012/0052689 A1 | 3/2012 | Tokashiki |
| 2012/0073754 A1 | 3/2012 | de la Llera et al. |
| 2012/0187844 A1 | 7/2012 | Hoffman et al. |
| 2012/0227484 A1 | 9/2012 | Chen et al. |
| 2012/0262064 A1 | 10/2012 | Nagarkatti et al. |
| 2013/0182951 A1 | 7/2013 | Shustorovich et al. |
| 2014/0062303 A1 | 3/2014 | Hoffman et al. |
| 2014/0066838 A1 | 3/2014 | Hancock |
| 2014/0076713 A1 | 3/2014 | Valcore, Jr. et al. |
| 2014/0305589 A1 | 10/2014 | Valcore, Jr. |
| 2015/0002018 A1 | 1/2015 | Lill et al. |

FOREIGN PATENT DOCUMENTS

| | | |
|---|---|---|
| JP | 2004239211 A | 8/2004 |
| JP | 2004-335594 A | 11/2004 |
| JP | 2005130198 A | 5/2005 |
| JP | 2005284046 A | 10/2005 |
| KR | 10-2005-0088438 A | 9/2005 |
| KR | 10-2005-0089995 A | 9/2005 |
| KR | 10-2007-0031915 A | 3/2007 |
| WO | 9914699 | 3/1999 |
| WO | 2008002938 A2 | 1/2008 |

(56) References Cited

FOREIGN PATENT DOCUMENTS

| WO | 2012054306 A2 | 4/2012 |
| WO | 2014070838 A1 | 5/2014 |

OTHER PUBLICATIONS

Darnon et al., "Synchronous Pulsed Plasma for Silicon Etch Applications", ECS Transactions, 27 (1) pp. 717-723 (2010), Publication by: The Electrochemical Society.
Lars Christoph Comparison of Applied Materials DPS chambers used for poly-Si Etch process by plasma parameters Dec. 6, 2000 2nd workshop on Self excited electron plasma resonance spectroscopy Dredsen Germany.
Christoph Steuer TOOL Comparison at GC stack Etch in LAM TCP Using Plasma Parameters (SEERS) Dec. 12, 2000 2nd workshop on self excited electron plasma resonance Sepectroscopy Germany.
PCT/US2010/057478 International Search Report and Written Opinion, mailed Jul. 26, 2011 (6 pages).
PCT/US2011/063422 International Search Report and Written Opinion, mailed Mar. 28, 2012 (9 pages).
PCT/US2010/057450 International Search Report and Written Opinion, mailed Jul. 18, 2011 (9 pages).

\* cited by examiner

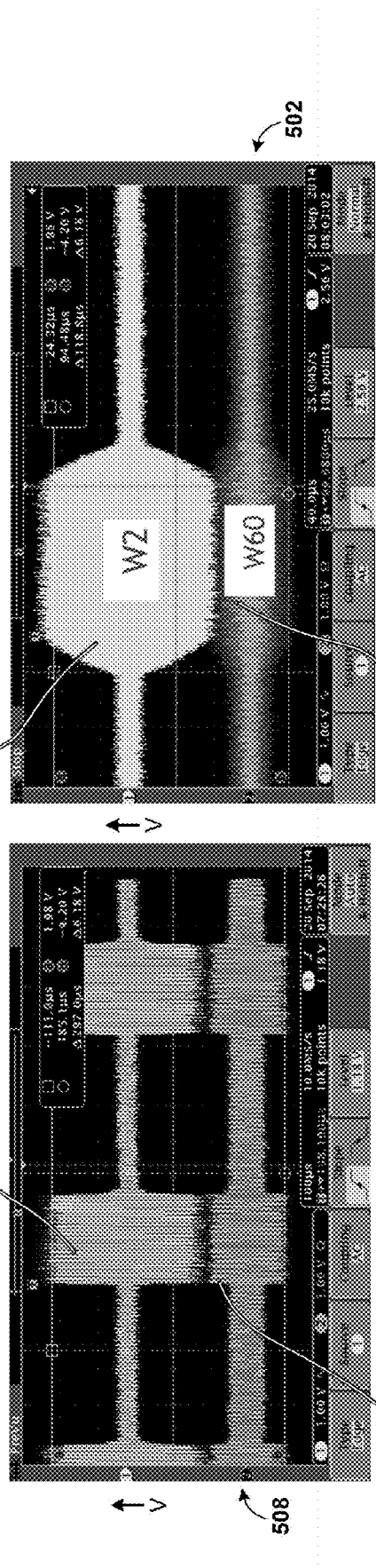
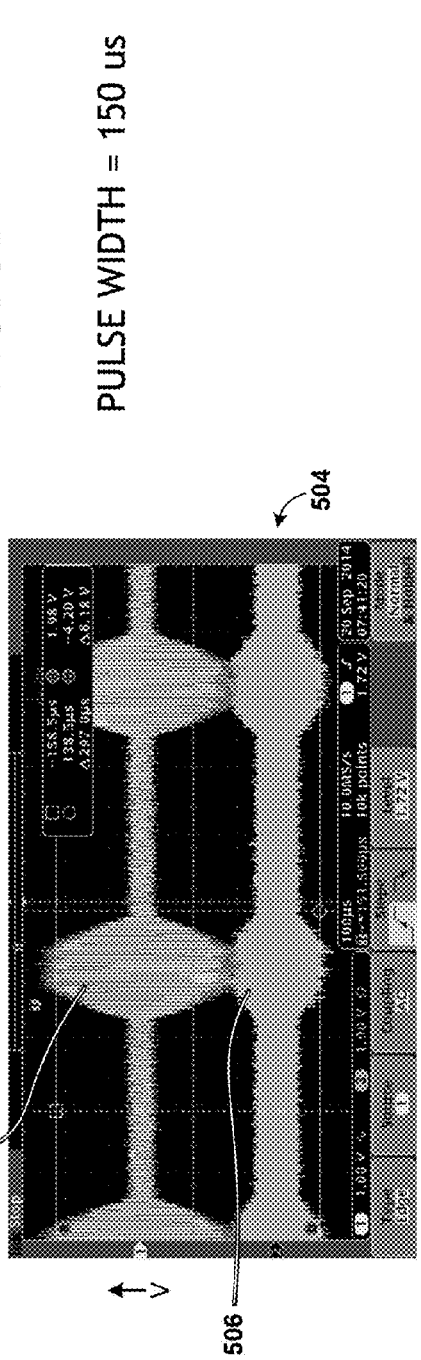
FIG. 5A
FIG. 5B
FIG. 5C

ION ENERGY CONTROL BY RF PULSE SHAPE

FIELD

The present embodiments relate to systems and methods for ion energy control by radio frequency (RF) pulse shape.

BACKGROUND

A wafer is etched using a plasma system. A wafer is a substrate that is made of a semiconductor material and used in electronics to manufacture integrated circuits. A variety of operations, e.g., etching, doping, ion implantation, deposition, photolithographic patterning, etc., are performed on the wafer to form integrated circuits on the wafer. The integrated circuits are then diced and packaged.

Current high aspect ratio (HAR) contact etch technology, e.g., HAR>50:1, etc., uses significantly low radio frequency (RF) signals to produce high energy ions. However, the high ion energy leads to significant mask loss.

Also, pulsed plasmas are typically used for better mask selectivity with low and high power plasma energy regimes to deposit polymer and to etch contact. The polymer is deposited using a low amount of power and the contact is etched using a high amount of power. However, most of the mask is lost during the high power pulse, e.g., when 2 megahertz (MHz) plasma produces none or small amount of low energy ions, etc.

It is in this context that embodiments described in the present disclosure arise.

SUMMARY

Embodiments of the disclosure provide apparatus, methods and computer programs for ion energy control by RF pulse shape. It should be appreciated that the present embodiments can be implemented in numerous ways, e.g., a process, an apparatus, a system, a device, or a method on a non-transitory computer-readable medium. Several embodiments are described below.

In various embodiments, a method for setting operational parameters of a plasma processing system used for etching a substrate layer when placed on an electrode of the plasma processing system is described. The method includes setting a pulsing frequency of a radio frequency (RF) generator, which produces an RF pulse signal having the pulsing frequency. The pulsing frequency switches between a low power level and a high power level. The high power level is defined between an envelope having a rise transition and a fall transition. The method further includes setting a slope parameter for modifying the RF pulse signal. The slope parameter is set for each of the rise transition and fall transition of the envelope. The slope parameter defines a reduction in a rate of rise for the rise transition and a reduction in a rate of fall for the fall transition. The reduction of the rate of rise and rate of fall shapes a reduced pulse width of the envelope at the high power level. The high power level has a shorter duration than the low power level during the pulsing frequency. The method includes supplying the RF pulse signal modified by the slope parameter to the electrode of the plasma processing system. An increase in low energy ions occurs during the rise transition and the fall transition when the RF pulse signal is modified by the slope parameter, and high ion energy is produced during the reduced pulse width of the envelope.

In some embodiments, a plasma processing system for setting operational parameters used for etching a substrate layer when placed on an electrode of the plasma processing system is described. The plasma processing system includes an RF generator for generating an RF pulse signal. The plasma processing system further includes a host computer. The host computer sets a pulsing frequency of the generator. The RF pulse signal has the pulsing frequency, which switches between a low power level and a high power level. The high power level is defined between an envelope having a rise transition and a fall transition. The host computer also sets a slope parameter for modifying the RF pulse signal. The slope parameter is set for each of the rise transition and fall transition of the envelope. The slope parameter defines a reduction in a rate of rise for the rise transition and a reduction in a rate of fall for the fall transition. The reduction of the rate of rise and rate of fall shapes a reduced pulse width of the envelope at the high power level. The high power level has a shorter duration than the low power level during the pulsing frequency. The RF generator supplies the RF pulse signal modified by the slope parameter to the electrode of the plasma processing system. An increase in low energy ions occurs during the rise transition and the fall transition when the RF pulse signal is modified by the slope parameter, and high ion energy is produced during the reduced pulse width of the envelope.

A method for setting operational parameters of a plasma processing system used for etching a substrate layer when placed on an electrode of the plasma processing system is described. The method includes setting a pulsing frequency of an RF generator, which produces an RF pulse signal having the pulsing frequency. The pulsing frequency switches among a low power level, a medium power level, and a high power level. The high power level is defined between an envelope having a rise transition and a first fall transition and the medium power level is defined between an envelope that starts from an edge of the first fall transition until an edge of a second fall transition. The method further includes setting a slope parameter for modifying the RF pulse signal. The slope parameter is set for each of the rise transition, the first fall transition, and the second fall transition. The slope parameter defines a reduction in a rate of rise for the rise transition, a reduction in a rate of fall for the first fall transition, and a reduction in a rate of fall for the second fall transition. The reduction of the rate of rise and the rate of fall for the first transition shapes a reduced pulse width of the envelope at the high power level and the reduction of the rate of fall for the second transition shapes a reduced pulse width of the envelope at the medium power level. Each of the high power level and the medium power level has a shorter duration than the low power level during the pulsing frequency. The method includes supplying the RF pulse signal modified by the slope parameter to the electrode of the plasma processing system. An increase in low energy ions occurs during the rise transition, the first fall transition, and the second fall transition when the RF pulse signal is modified by the slope parameter, and high ion energy is produced during the reduced pulse width of the envelopes at the high and medium power levels.

In several embodiments, a method includes receiving a setting indicating that an etch operation is to be performed on a substrate stack using an RF pulse signal. The RF pulse signal includes a first state and a second state. The first state has a higher power level than the second state. Moreover, the RF pulse signal is to be sent from an RF generator to an impedance matching circuit to be modified to generate a modified signal, which is to be sent to a plasma chamber.

The method further includes receiving a pulse slope associated with the RF pulse signal. The pulse slope provides a transition between the first state and the second state for the RF generator. Also, the pulse slope is other than substantially infinite for reducing an amount of ions with high energy during the etch operation. The method includes determining power levels and timings for achieving the pulse slope and sending the power levels and the timings to an RF generator to generate the RF pulse signal.

In various embodiments, a method includes receiving a setting indicating that an etch operation is to be performed on a substrate stack using an RF pulse signal, which includes a first state and a second state. The first state has a higher power level higher than the second state. The RF pulse signal is to be sent to an impedance matching circuit to be modified to generate a modified signal, which is to be sent to a plasma chamber. The method further includes receiving a pulse slope associated with the RF pulse signal. The pulse slope provides a transition from the second state to the first state for the RF generator. The pulse slope is other than substantially infinite for reducing an amount of ions with high energy during the etch operation. The method also includes determining power levels and timings for achieving the pulse slope, sending the power levels and the timings to an RF generator to generate the RF pulse signal, and receiving an additional slope associated with the RF pulse signal. The additional slope provides a transition from the first state to a third state and is other than substantially infinite for reducing the amount of ions with high energy. The method includes determining power levels and timings for achieving the additional slope, sending the power levels and the timings for achieving the additional slope to the RF generator to generate the RF pulse signal, and receiving another additional slope associated with the RF pulse signal. The other additional slope provides a transition from the third state to the second state and is other than substantially infinite for reducing the amount of ions with high energy. The method includes determining power levels and timings for achieving the other additional slope and sending the power levels and the timings for achieving the other additional slope to the RF generator to generate the RF pulse signal.

In several embodiments, a method includes receiving an indication that an etch operation is to be performed using an RF pulse signal, which transitions between a first state and a second state. The RF pulse signal is generated by an RF generator, which is coupled via an impedance matching circuit to a plasma chamber. The first state has higher power levels than the second state. The method further includes receiving an indication that an amount of ions having high energy to be generated by the pulse be less than a pre-determined threshold. The method also includes determining multiple power levels associated with the first state for performing the etch operation upon receiving the indication that the etch operation is to be performed and the amount of ions having high energy be less than the pre-determined threshold. The method includes determining timings for achieving the power levels. The timings provide a rise time and a fall time during the first state of the RF pulse signal. The rise time is for achieving the first state from the second state and the fall time is for achieving the second state from the first state. A slope of the rise time or the fall time is other than substantially infinite.

Some advantages of various embodiments of the systems and methods described herein include increasing a number of low-energy ions during a processing operation, e.g., an etching operation, a sputtering operation, a deposition operation, a combination thereof, etc. The low-energy ions are increased by changing a shape of an RF pulse to a shape other than a square-shaped pulse. A control of a ratio of low-energy ions to high-energy ion flux facilitates control of polymer deposition and etch rate on a surface of a mask layer and at a bottom of a contact hole.

Other advantages of the herein described systems and methods include that the low-energy ions facilitate polymerization, e.g., deposition with a polymer, etc., of a substrate and protect a mask layer that is deposited on the substrate. The mask layer is less vulnerable to erosion by the low-energy ions compared to the high-energy ions. Also, the polymerization helps suppress a blanket etch rate of etching the etch layer of the substrate stack.

Other aspects will become apparent from the following detailed description, taken in conjunction with the accompanying drawings.

BRIEF DESCRIPTION OF THE DRAWINGS

The embodiments may best be understood by reference to the following description taken in conjunction with the accompanying drawings.

FIG. 5A is a graph to illustrate pulse rise times and pulse fall times of square-shaped RF signals that have substantially infinite slopes, in accordance with an embodiment described in the present disclosure.

FIG. 5B is a graph to illustrate pulse rise times and pulse fall times of RF pulse signals that have other than substantially infinite slopes, in accordance with an embodiment described in the present disclosure.

FIG. 5C is a graph to illustrate pulse rise times and pulse fall times of an RF pulse signals that have other than substantially infinite slopes, in accordance with an embodiment described in the present disclosure.

DETAILED DESCRIPTION

The following embodiments describe systems and methods for ion energy control by radio frequency (RF) pulse shape. It will be apparent that the present embodiments may be practiced without some or all of these specific details. In other instances, well known process operations have not been described in detail in order not to unnecessarily obscure the present embodiments.

Figure 1:
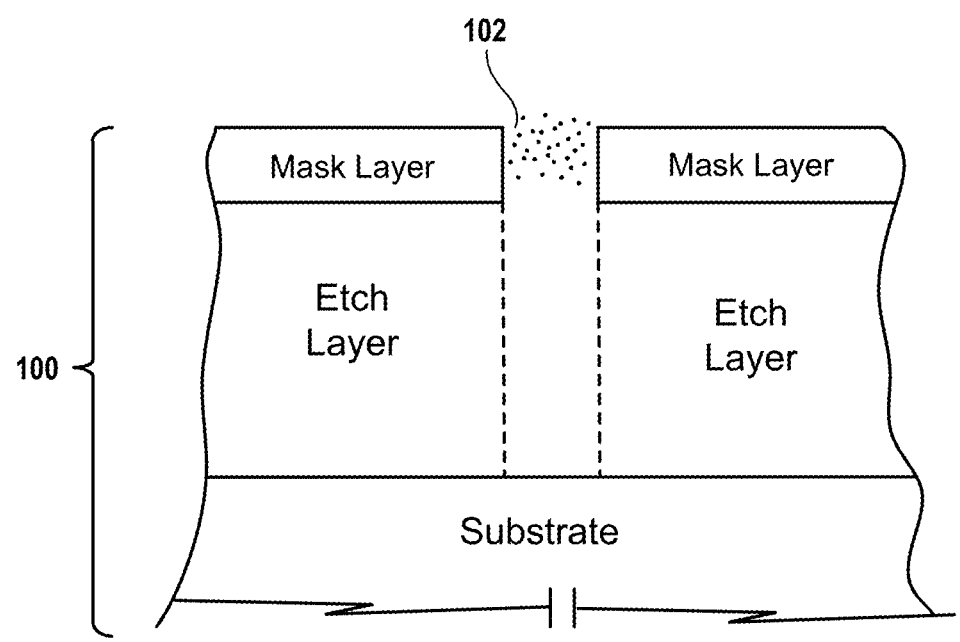
FIG. 1 is a diagram of a substrate stack for illustrating an etching operation, in accordance with an embodiment described in the present disclosure

FIG. 1 is a diagram of an embodiment of a substrate stack 100 for illustrating an etching operation. The substrate stack 100 includes a substrate layer, an etch layer, and a mask layer. An etch layer is sometimes referred to herein as a substrate layer. The etch layer is overlaid on top of the substrate layer and the mask layer is overlaid on top of the etch layer. Examples of the etch layer include a silicon dioxide layer, a silicon nitride layer, a layer that includes silicon dioxide and silicon nitride, a silicon dioxide layer overlaid with a carbon layer, a silicon oxycarbide, etc. The etch layer is overlaid with the mask layer, e.g., a photoresist layer, etc. The mask layer has a number of contact holes, e.g., openings, a contact hole 102, etc.

In some embodiments, the contact hole 102 has a substantially vertical or a vertical sidewall and has a high aspect ratio, which is specified as a setting that is provided to an RF generator. Further description of settings and RF generators is provided below.

The etch layer is plasma etched during the etching operation and the mask layer protects areas of the etch layer not to be etched. The etch layer is etched to extend the contact hole 102 through the etch layer. Features, e.g., metal interconnecting wires, conductors, etc., are formed within contact holes formed on the substrate. In some embodiments, the contact holes are used as capacitor trenches.

Plasma is generated within a plasma chamber, which is further described below, and the plasma includes high-energy ions, e.g., ions formed by supplying a high amount of power during a steady state of an RF pulse signal. Examples of the high amount of power include 5000 watts, 10000 watts, 15000 watts, an amount between 5000 watts and 15000 watts, etc. In some embodiments, the high amount of power includes an amount of power that is generated during a state S1 of a square-shaped pulsed RF signal. The state S1 is further described below.

The mask layer is eventually removed, e.g., when it is no longer needed, etc., using a resist stripper or plasma containing oxygen or a chemical solution, etc.

Figure 2:
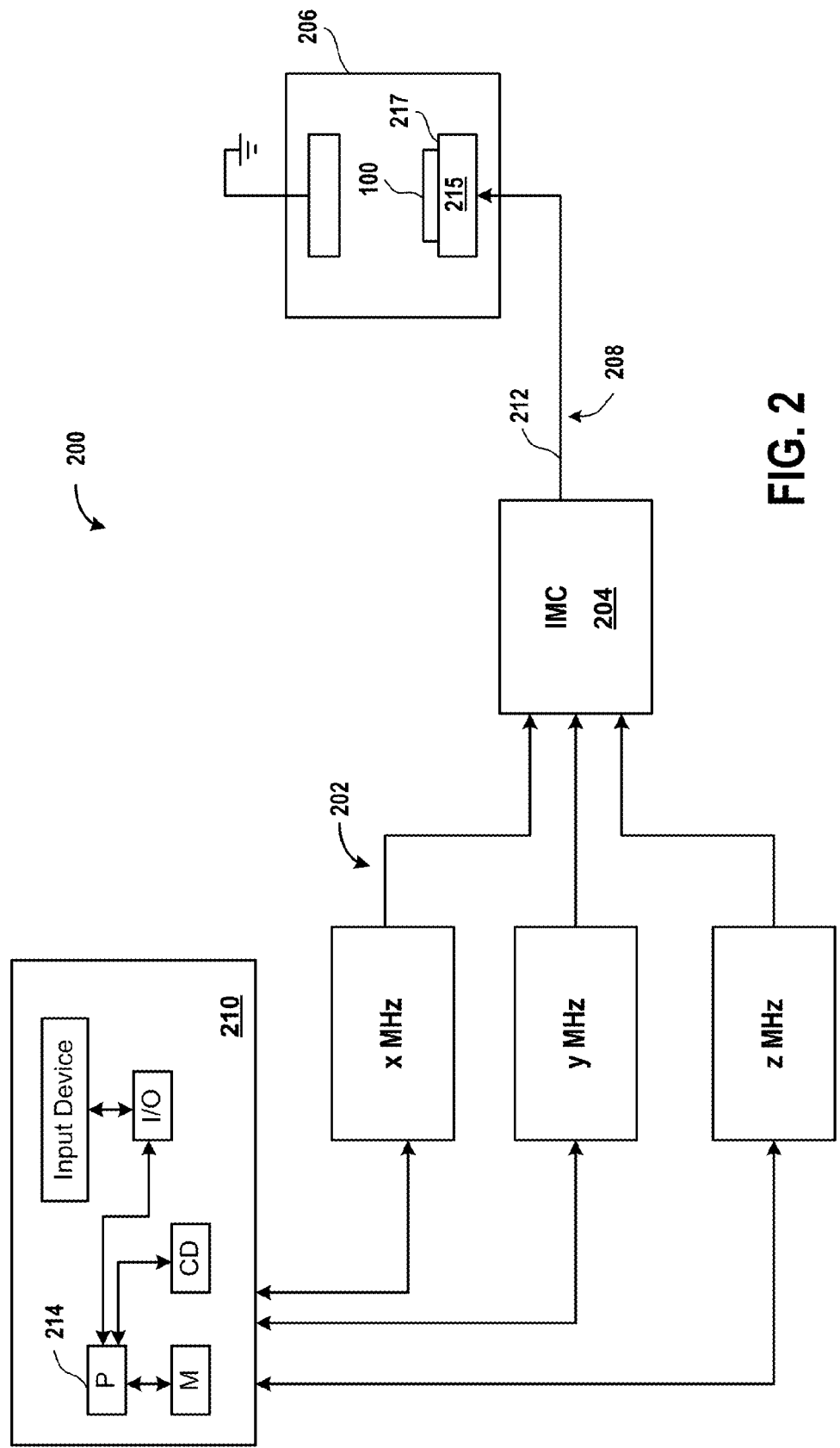
FIG. 2 is a diagram of a plasma system for illustrating a processing operation that is performed to generate low-energy ions, in accordance with an embodiment described in the present disclosure.

FIG. 2 is a diagram of an embodiment of a plasma system 200 for illustrating a processing operation, e.g., an etching operation, a sputtering operation, a deposition operation, a combination thereof, etc., which is performed to generate low-energy ions with wide energy distribution. The system 200 includes an x megahertz (MHz) RF generator, a y MHz RF generator, and a z MHz RF generator.

An example of the x MHz RF generator includes an RF generator that has an operation frequency of 2 MHz, an example of the y MHz RF generator includes an RF generator that has an operation frequency of 27 MHz, and an example of the z MHz RF generator includes an RF generator that has an operation frequency of 60 MHz. It should be noted that in some embodiment, an operation frequency of x MHz includes an operation frequency that ranges between x−X MHz and x+X MHz, an operation frequency of y MHz includes an operation frequency that ranges between y−Y MHz and y+Y MHz, and an operation frequency of z MHz includes an operation frequency that ranges between z−Z MHz and z+Z MHz where each of "X", "Y", and "Z" is a positive real number. For example, the operation frequency of 2 MHz includes an operation frequency that ranges between 1.8 MHz and 2.2 MHz. As another example, the operation frequency of 60 MHz includes an operation frequency that ranges between 57 MHz and 63 MHz.

The system 200 further includes a host system 210, an impedance matching circuit (IMC) 204, and a plasma chamber 206. The host system 210 is connected to each of the x, y, and z MHz RF generators. The x MHz RF generator is coupled via an RF cable to the IMC 204. Similarly, the y and z MHz RF generators are coupled via corresponding RF cables to the IMC 204. The IMC 204 is connected via an RF transmission line 212 to a chuck 215 of the plasma chamber 206. Examples of the chuck 215 include an electrostatic chuck (ESC), another type of chuck, etc.

In some embodiments, the RF transmission line 212 includes a bias housing that further includes an RF cylinder that is coupled to an RF strap at one end and to the chuck 215 at another end. The RF strap is connected to the IMC 204.

The host system 210 includes a processor 214, a memory device (designated as "M" in FIG. 2), a communication device (CD), an input device, and an input/output (I/O) interface. The input device is connected to the processor 214 via the I/O interface. Examples of the input device include a keyboard, a touchscreen, a keypad, a mouse, a stylus, etc. Moreover, examples of a processor include a central processing unit (CPU), a controller, an application specific integrated circuit (ASIC), a programmable logic device (PLD), a field programmable gate array (FPGA), etc. Furthermore, examples of a memory device include a read-only memory (ROM), a random access memory (RAM), a hard disk, a volatile memory, a non-volatile memory, a redundant array of storage disks, a Flash memory, etc. A communication device facilitates communication of parallel communication of data, or serial communication of data, or a combination thereof.

The plasma chamber 206 further includes an upper electrode. The upper electrode is made of an electrically conductive material, e.g., aluminum, alloy of aluminum, low resistivity silicon, etc. The upper electrode is located opposite to and facing the lower electrode of the chuck. The upper electrode is grounded, e.g., coupled to a reference voltage, coupled to zero voltage, coupled to a negative voltage, etc.

In various embodiments, the lower electrode of the chuck 215 is made of a metal, e.g., anodized aluminum, alloy of aluminum, etc. In some embodiments, the chuck 215 includes the lower electrode and a ceramic layer placed with respect to, e.g., on top of, etc., the lower electrode. In various embodiments, the chuck 215 includes the lower electrode, the ceramic layer, and a facility plate placed with respect to, e.g., below, etc., the lower electrode. The substrate stack 100 is placed on a top surface 217 of the chuck 215 for processing, e.g., depositing materials on the substrate, or cleaning the substrate stack 100, or etching deposition layers from the substrate stack 100, or doping the substrate, or sputtering the substrate stack 100, or a combination thereof.

In some embodiments, instead of a host system, a server or a virtual machine is used. For example, the server or virtual machine executes the same functions described herein as performed by the host system 210.

In some embodiments, the plasma system 200 includes any number of operational RF generators. For example, the x MHz RF generator is operational, e.g., functional, powered on, etc., and the y and z MHz RF generators are non-operational. As another example, the x and y MHz RF generators are operational and the z MHz RF generator is non-operational.

Figure 3A:
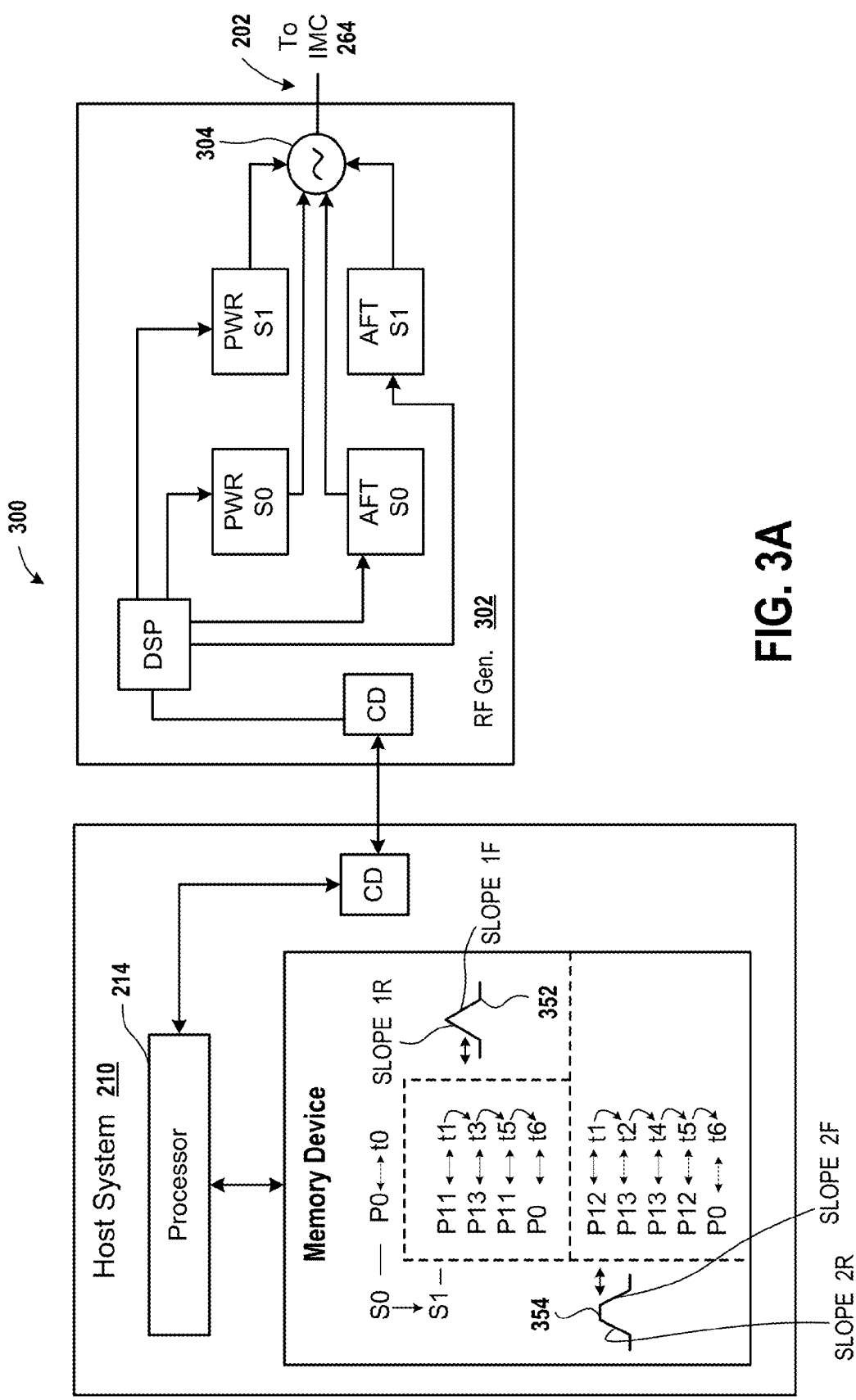
FIG. 3A is a diagram of a system to illustrate generation of low-energy ions using a radio frequency (RF) generator of the plasma system of FIG. 2, in accordance with an embodiment described in the present disclosure.
Figure 3B:
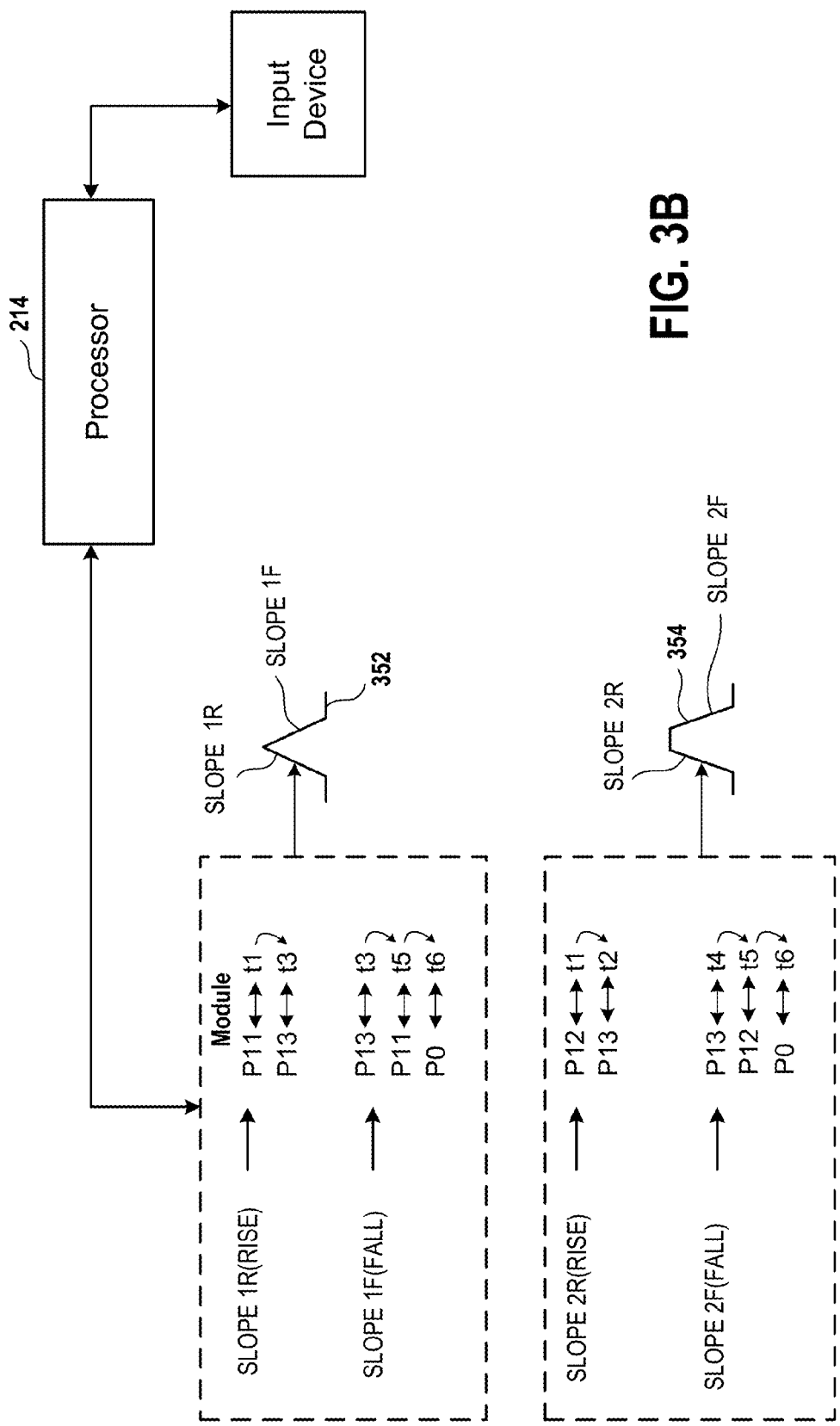
FIG. 3B is a diagram to illustrate generation of power levels from various slopes of an RF pulse signal, in accordance with an embodiment described in the present disclosure.
Figure 3C:
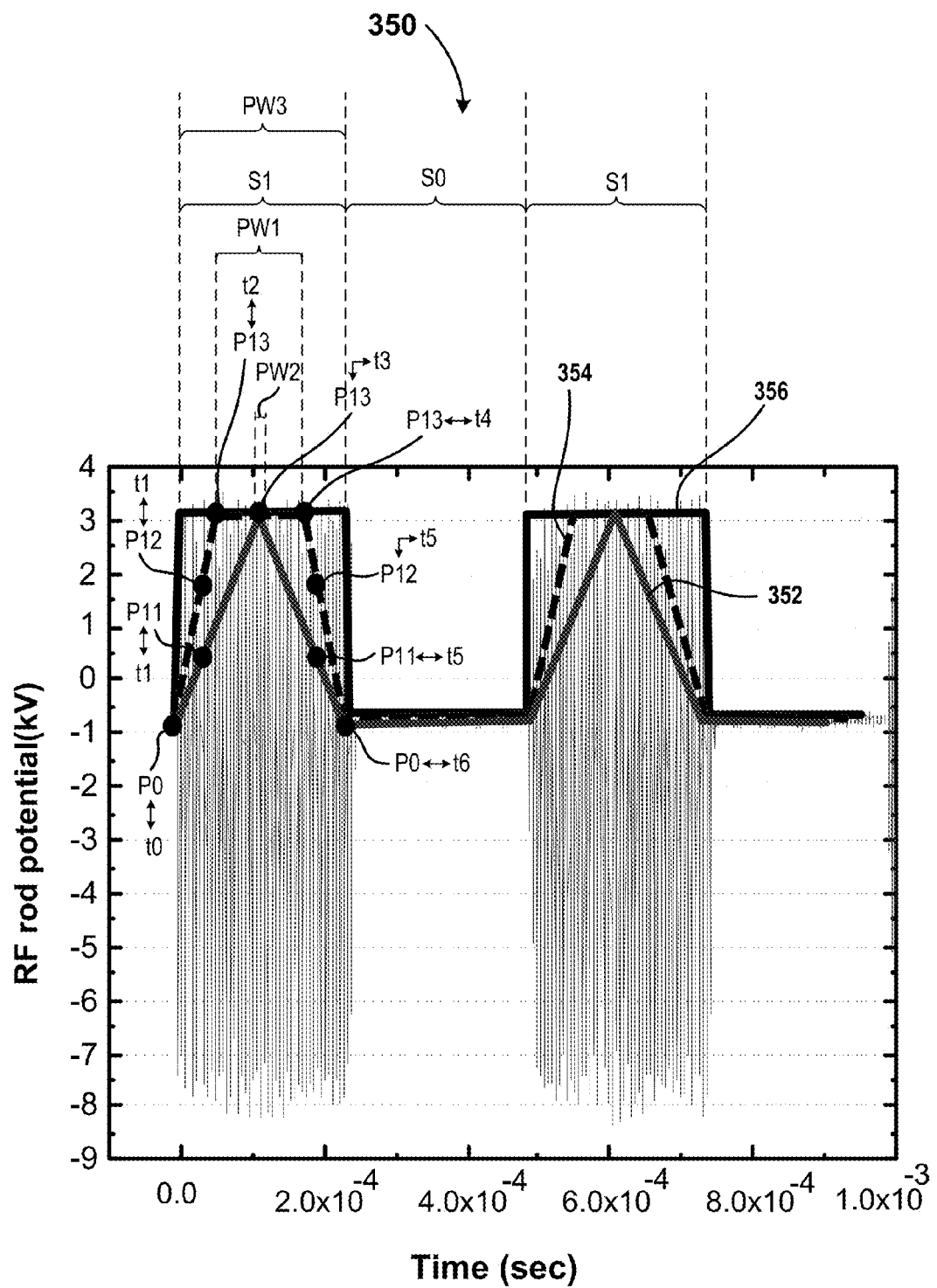
FIG. 3C is a diagram used to illustrate various slopes of an RF pulse signal, in accordance with an embodiment described in the present disclosure.

FIG. 3A is a diagram of an embodiment of a system 300 to illustrate generation of low-energy ions using an RF generator 302 of the plasma system 200 (FIG. 2), FIG. 3B is a diagram to illustrate generation of power levels from various slopes of an RF pulse signal 202 (FIG. 2), and FIG. 3C is a diagram used to illustrate the various slopes. The RF generator 302 is an example of any of the x, y, and z MHz RF generators.

The processor 214 receives from a user via the input device a type of processing operation to be performed. For example, the processor 214 receives a signal indicating that an etching operation, a deposition operation, a sputtering operation, a cleaning operation, or a combination thereof, etc., is to be performed on the substrate stack 100.

The processor 214 receives from the user via the input device one or more slopes of an RF pulse signal, e.g., the RF pulse signal 202, etc., that is to be generated by the RF generator 302. For example, a slope, e.g., SLOPE 1R of an RF pulse signal 352 shown in FIGS. 3B and 3C, SLOPE 2R of an RF pulse signal 354 shown in FIGS. 3B and 3C, etc., to be achieved during a rise transition of the RF pulse signal 202 is received and a slope, e.g., a slope 1F, a slope 2F, etc., to be achieved during a fall transition of the RF pulse signal 202 is received. The rise transition is a transition from a state S0, e.g., a low state, etc., to the state S1, e.g., a high state, etc. The high state has a higher amount of power level than that of the low state. For example, all power amounts of the high state are greater than that of the low state. In some embodiments, a power level includes one or more power amounts.

Moreover, power amounts associated with a steady state, e.g., a pulse width, etc., for each state S1 and S0 are received by the processor 214 from the user via the input device. A steady state of an RF pulse signal is further described below.

The processor 214 determines power amounts and timings of an RF pulse signal to be generated by the RF generator 302 based on the one or more slopes received, power amounts associated with a steady state, and a clock cycle of a clock signal that is received from a clock source, e.g., a clock oscillator, a clock oscillator coupled with a phase-locked loop, etc. For example, with reference to FIGS. 3B and 3C, the processor 214 determines that to achieve the slope 1R, the RF pulse signal 352 is to achieve a power amount P11 during a time t1 and a power amount P13 during a time t3. The processor 214 determines that the power amount P11 is to be achieved from a power amount P0 that is achieved at a time t0. The power amount P0 is associated with a steady state of the state S0 and the power amount P13 is associated with a steady state of the state S1. The times t0, t1, and t3 are determined from a duty cycle of the clock cycle and from the slope 1R. Moreover, the processor 214 determines that to achieve the slope 1F, the RF pulse signal 352 is to achieve a power amount P11 during a time t5 from the power amount P13 at the time t3, and thereafter to achieve the power amount P0 at a time t6. The times t3, t5, and t6 are determined from the duty cycle of the clock cycle and the slope 1F.

As another example, with reference to FIGS. 3B and 3C, the processor 214 determines that to achieve the slope 2R, the RF pulse signal 354 is to achieve a power amount P12 at the time t1 from the power amount P0 at the time t0, and determines that the RF pulse signal 354 is to achieve the power amount P13 at a time t2. The times t0, t1, and t2 are determined from the duty cycle of the clock cycle and the slope 2R. Furthermore, the processor 214 determines that to achieve the slope 2F of the RF pulse signal 354, the power amount P12 is to be achieved at the time t5 from the power amount P13 at a time t4, and the power level P0 is to be achieved at the time t6. The times t4, t5, and t6 are determined from the clock cycle and the slope 2F.

It should be noted that the timings t1 thru t6 are in a successive order. For example, the time t6 is greater than the time t5, the time t5 is greater than the time t4, the time t3 is greater than the time t2, the time t2 is greater than the time t1, and the time t1 is greater than the time t0.

Moreover, based on a rise transition slope and a fall transition slope during a duty cycle of the clock signal, the processor 214 calculates an amount of time for a steady state of the state S1 to occur. For example, upon determining power amounts and timings for a rise transition slope and for a fall transition slope during a duty cycle of the clock signal, the processor 214 determines that the power amount P13 be maintained for a remaining time period, e.g., corresponding to a pulse width PW1, corresponding to a pulse width PW2, etc., of the duty cycle of the clock signal. To further illustrate, to achieve the slope 2R and the slope 2F of the RF pulse signal 354, the processor 214 determines that a steady state for the state S1 is to be maintained for a time period between the times t2 and t4. As another example, to achieve the slope 1R and the slope 1F of the RF pulse signal 352, the processor 214 determines that a steady state for the state S1 is to be maintained for the time t3.

In various embodiments, a steady state during a state, e.g., the state S1, etc., includes one or more power amounts that are within a pre-determined range of one of the power amounts, and the pre-determined range is outside a pre-determined range of one or more power amounts of an opposite steady state, e.g., the state S0, etc. For example, a steady state of the state S1 includes power amounts ranging from 1950 to 2050 watts and a steady state of the state S0 includes power amounts ranging from 0 watts to 20 watts.

In various embodiments, high-energy ions are generated during a steady state of the state S1 and low-energy ions are generated during a time period remaining during the state S1.

The clock cycle indicates a number of states of an RF pulse signal to be generated. For example, the clock cycle has the two states S1 and S0 to indicate to the processor 214 that an RF pulse signal having power levels and timings associated with the two states S1 and S0 is to be generated. The two states of the RF pulse signal are to be generated in synchronization with the two states of the clock signal. To illustrate, the processor 214 determines that an RF pulse signal initiates a transition for achieving the state S1 when the clock signal achieves the state S1 and that the RF pulse signal initiates a transition for achieving the state S0 when the clock signal achieves the state S0.

In various embodiments, instead of the one or more slopes, the processor 214 receives from the user via the input device power amounts and timings of an RF pulse signal to be generated by the RF generator 302. For example, the processor 214 receives signals indicating that to generate the RF pulse signal 352, the power amount P11 is to be achieved at the time t1, the power amount P13 is to be achieved at the time t3, the power amount P11 is to be achieved at the time t5, and the power amount P0 is to be achieved at the time t6. The signals also indicate that the power amount P11 is to be achieved after the power amount P0 is achieved at the time t0. As another example, the processor 214 receives signals indicating that to generate the RF pulse signal 354, the power amount P12 is to be achieved at the time t1, the power amount P13 is to be achieved at the time t2, the power amount P13 is to be maintained for a time period until the time t4, the power amount P12 is to be achieved at the time t5, and the power amount P0 is to be achieved at the time t6. The power amount P12 is to be achieved from the power amount P0 at the time In some embodiments, instead of the one or more slopes, the processor 214 receives a signal from the user via the input device that an amount of ion energy to be generated by an RF pulse of an RF generator is less than a pre-determined threshold. For example, an amount of ions with high energy that are generated using the square-shaped pulse signal is greater than the pre-determined threshold and an amount of ions with high energy that are generated using an RF pulse signal having a rise transition slope other than a substantially infinite slope and/or a fall transition slope other than a substantially infinite slope is less than the pre-determined threshold. The processor 214 determines power amounts and timings to facilitate generation of an RF pulse signal to further generate an amount of ion energy less than the pre-determined threshold. The amount of ion energy is measured using an ion energy distribution measurement device (IEMD) (not shown), which is further described below, to determine whether the ion energy is less than the pre-determined threshold. A manner of determining that the ion energy is less than the pre-determined threshold is described below. The processor 214 modifies power amounts and timings upon determining that the ion energy is greater than the pre-determined threshold. The power amounts and timings are modified to decrease the ion energy to be less than the pre-determined threshold.

FIG. 3C shows an embodiment of a graph 350 to illustrate the power amounts P0, P11, P12, and P13, and to illustrate the timings t0 thru t6 associated with the power amounts. The graph 350 plots a potential that is measured at the RF rod versus time. It should be noted that the graph 350 includes the two RF pulse signals 352 and 354, each of which is an example of the RF pulse signal 202 (FIG. 2). A rise transition, e.g., the slope 1R, etc., of the RF pulse signal 352 intersects a fall transition, e.g., the slope 1F, etc., of the RF pulse signal 352. On the other hand, a rise transition, e.g., the slope 2R, etc., of the RF pulse signal 354 does not intersect a fall transition, e.g., the slope 2F, etc., of the RF pulse signal 354. The rise transition of the RF pulse signal 354 is separated from the fall transition of the RF pulse signal 354 by a steady state of the state S1.

The RF pulse signal 354 has the pulse width of PW1 during a steady state of the state S1. Moreover, the RF pulse signal 352 has the pulse width of PW2 during a steady state of the state S1. Also, the square-shaped pulse signal 356 has a pulse width of PW3 during a steady state of the state S1. It should be noted that the pulse width PW2 is less than the pulse width PW1, which is less than the pulse width PW3.

A time period occupied by the pulse width PW1 of an RF pulse of an RF pulse signal, a rise transition of the RF pulse, and a fall transition of the RF pulse forms a duty cycle of the RF pulse signal. The duty cycle is synchronous with the clock signal, e.g., a transistor-transistor logic (TTL) signal, etc. For example, a high level of the clock signal occurs during the duty cycle of the RF pulse signal.

It should be noted that each of the slopes 1R, 2R, 1F, and 2F are less than a substantially infinite slope of the square-shaped pulse signal 356. For example, for a duty cycle of a clock signal or a TTL signal that lasts for 230 microseconds, a rise time of the RF pulse signal 354 is 100 microseconds or approximately 100 microseconds. The rise time of the RF pulse signal 354 is greater than a rise time of the square-shaped pulse signal 356, which is 5 microseconds or approximately 5 microseconds. Moreover, a fall time of the RF pulse signal 354 is 100 microseconds or approximately 100 microseconds. The fall time of the RF pulse signal 354 is greater than a fall time of the square-shaped pulse signal 356 that is 5 microseconds or approximately 5 microseconds. Also, a steady state time during the state S1 for the RF pulse signal 354 is 30 microseconds or approximately 30 microseconds and a steady state time during the state S1 for the square-shaped pulse signal 356 is 220 microseconds or approximately 220 microseconds.

Other examples of transition times, e.g., rise times, fall times, etc., of an RF pulse signal that does not have a substantially infinite slope include a time ranging from 7 microseconds to 114.5 microseconds for a duty cycle of 230 microseconds. Moreover, other examples of times for which a steady state is maintained for the state S1 of an RF pulse signal that does not have a substantially infinite slope include a time ranging from 1 microsecond to 216 microseconds for a duty cycle of 230 microseconds.

With reference to FIG. 3A, power amounts and timings associated with the states S1 and S0 of an RF pulse signal, e.g., the RF pulse signal 352, the RF pulse signal 354, etc., are provided by the processor 214 via the communication device of the host system 210 to a communication device of the RF generator 302. The communication device of the RF generator 302 provides power amounts and timings for the states S1 and S0 received from the host system 210 to a digital signal processor (DSP) of the RF generator 302.

The DSP of the RF generator 302 receives power amounts and timings for the states S1 and S0 from the communication device of the RF generator 302, and identifies power amounts and timings for the state S0 and power amounts and timings for the state S1. For example, the DSP distinguishes power amounts and timings for the state S0 from power amounts and timings for the state S1.

The DSP sends power amounts and timings for the state S1 to a power controller PWRS1 of the RF generator 302. For example, the DSP sends the power amounts P0, P11, P13, and the timings t1, t3, t5, and t6 associated with the state S1 of RF pulse signal 352 (FIGS. 3A & 3B) to the power controller PWRS1. As another example, the DSP sends the power amounts P12, P13, and P0 and the timings t1, t2, t4, t5, and t6 for the state S1 of the RF pulse signal 354 (FIGS. 3A & 3B) to the power controller PWRS1. Moreover, the DSP sends power amounts and timings for the state S0 to a power controller PWRS0 of the RF generator 302. As an example, the DSP sends the power amount P0 and the timings t0 and t6 for the state S0 of the RF pulse signal 352 to the power controller PWRS0. As another example, the DSP sends the power amount P0 and the timings t0 and t6 for the state S0 of the RF pulse signal 354 to the power controller PWRS0.

Each power controller PWRS1 and PWRS0 drives, e.g., via a transistor, one or more transistors, etc., an RF power supply 304 of the RF generator 302. For example, the power controller PWRS1 drives the RF power supply 304 during the state S1 by providing power amounts and timings for the state S1 to the RF power supply 304, and the power controller PWRS0 drives the RF power supply 304 during the state S0 by providing power amounts and timings for the state S0 to the RF power supply 304. The RF power supply 304 is driven during the states S1 and S0 to generate an RF pulse signal, e.g., the RF pulse signal 352, the RF pulse signal 354, etc.

The RF pulse signal that is generated by the RF power supply 304 is sent from the RF power supply 304 to the IMC 204 (FIG. 2). Similarly, RF pulse signals that are generated by the y and z MHz RF generators are provided to the IMC 204. The IMC 204 receives the RF pulse signals from the x, y, and z MHz RF generators, and combines the RF pulse signals to generate a modified RF signal 208 (FIG. 2), which is a pulse signal.

While combining the RF pulse signals, the IMC 204 matches an impedance of a load connected to an output of the IMC 204 with that of a source connected to an input of the IMC 204 to generate the modified RF signal 208. Examples of the source include the x, y, and z RF generators and the RF cables that couple the RF generators to the IMC 204. Examples of the load include the RF transmission line 212 (FIG. 2) and the plasma chamber 206 (FIG. 2). The modified RF signal 208 is provided by the IMC 204 via the RF transmission line 212 to the chuck 215 (FIG. 2).

At a time the modified RF signal 208 is supplied from the IMC 204 to the chuck 215, a process gas, e.g., an oxygen-containing gas, a fluorine-containing gas, a gas containing carbon and fluorine, etc. is supplied between an upper electrode and the chuck 215 via gas inlets in the upper electrode. An example of the oxygen-containing gas includes oxygen and examples of the fluorine-containing gas include tetrafluoromethane ($CF_4$), sulfur hexafluoride ($SF_6$), hexafluoroethane ($C_2F_6$), $C_4F_6$ gas, $C_4F_3$ gas, $C_3F_8$ gas, etc. When both the process gas and the modified RF signal 208 are supplied to the plasma chamber 206, plasma is generated or is maintained within the plasma chamber 206.

In some embodiments, each power controller of an RF generator is a part of a DSP of the RF generator. For example, the power controllers PWRS0 and PWRS1 of the RF generator 302 are a portion of a computer code that is executed by the DSP of the RF generator 302.

It should be noted that in various embodiments, the RF generator 302 includes an auto frequency tuner (AFT) for the state S0, referred to herein as AFTS0, and another AFT for the state S1, referred to herein as an AFTS1. The DSP receives one or more frequencies for the state S1 and timings associated with the frequencies for the state S1 and receives one or more frequencies for the state S0 from the processor 214 and timings associated with the frequencies for the state S0 via the communication device of the host system 210 and the communication device of the RF generator 302. The DSP distinguishes between the one or more frequencies for the state S1 from the one or more frequencies for the state S0. The DSP provides one or more frequencies and the timings associated with the frequencies for the state S0 to the AFTS0, and provides the one or more frequencies and the timings associated with the frequencies for the state S1 to the AFTS1. The AFTS1 drives via a driver the RF power supply 304 to achieve frequencies and timings for the state S1, and the AFTS0 drives via a driver the RF power supply 304 to achieve frequencies and timings for the state S0. The RF power supply 304 generates the RF pulse signal having the frequencies and timings associated with the state S0 and having the frequencies and timings associated with the state S1.

In various embodiments, each AFT of an RF generator is a part of a DSP of the RF generator. For example, the AFTS0 and AFTS1 of the RF generator 302 is a portion of a computer code that is executed by the DSP of the RF generator 302.

In some embodiments, in addition to a rise time slope and a fall time slope, a shape of the rise time slope and/or a shape of the fall time slope is received from the user via the input device by the processor 214. For example, a signal indicating that a rise transition slope is of a curved shape, e.g., sinusoidal shape, exponential shape, etc., or a straight shape, e.g., a shape of a line, etc., and a time period for achieving the rise transition from the state S0 to the state S1 is received from the user via the input device. In this example, a signal indicating that a fall transition slope is of a curved shape, e.g., sinusoidal shape, exponential shape, etc., or a straight shape and a time period for achieving the fall transition from the state S1 to the state S0 is received from the user via the input device. The processor 214 determines power amounts and timings in a manner similar to that described above based on a shape of a transition, a time period of the transition, and the duty cycle of the clock signal.

Figure 3D:
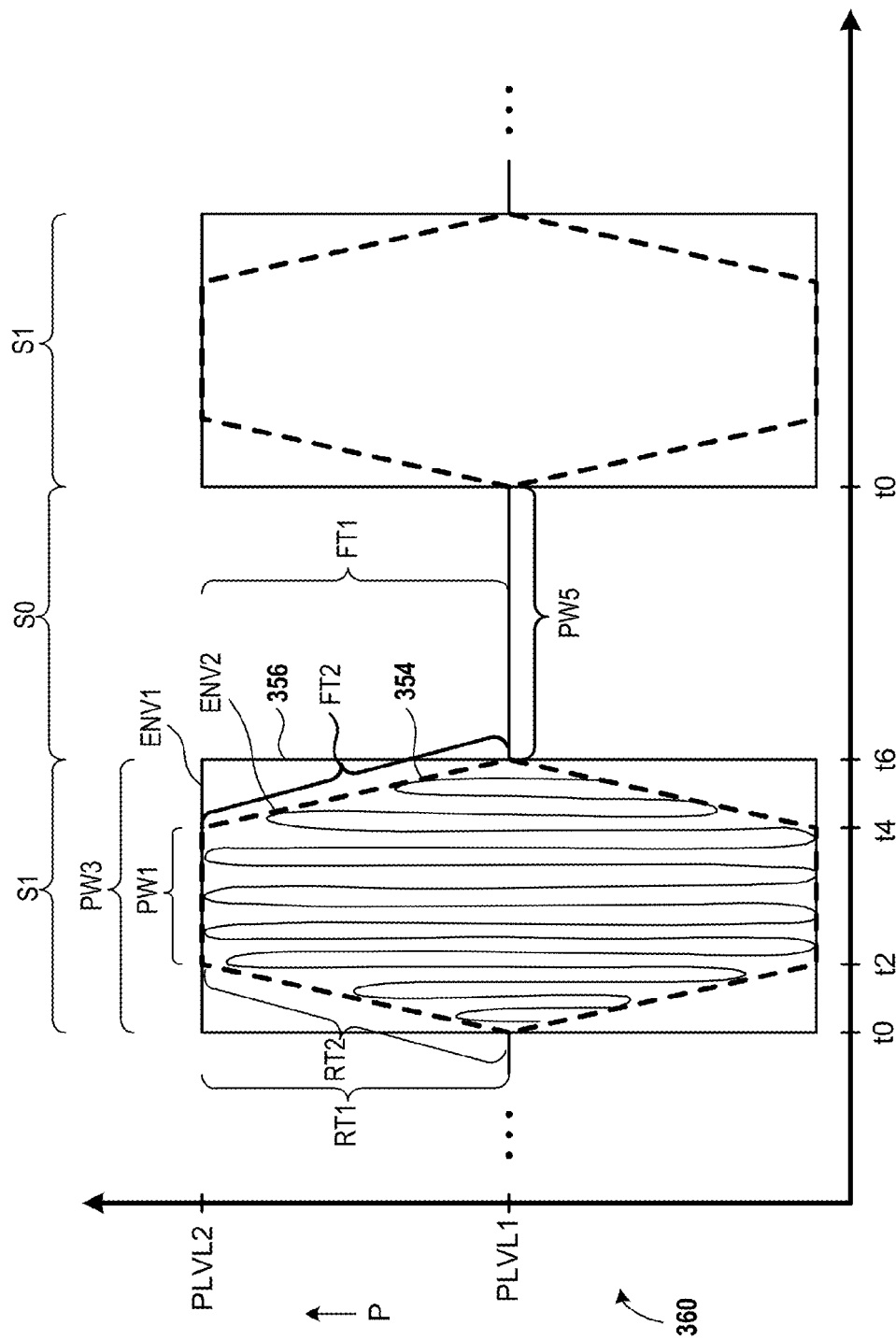
FIG. 3D is an embodiment of a graph to illustrate a change in transition time of a square-shaped pulse signal to generate low-energy ions within a plasma chamber of the plasma system of FIG. 2.

FIG. 3D is an embodiment of a graph 360 to illustrate a change in transition time of the square-shaped pulse signal 356 to generate low-energy ions within the plasma chamber 206 (FIG. 2). The graph 360 plots power of an RF pulse signal versus time t. The processor 214 (FIG. 2) sets, e.g., determines, identifies, etc., a pulsing frequency of the RF generator 302 (FIG. 3A). For example, the pulsing frequency of the RF generator 302 is set to produce the square-shaped pulse signal 356 or the RF pulse signal 354. It should be noted that the pulsing frequency of the RF pulse signal 354 and 356 is the same. The pulsing frequency of the square-shaped pulse signal 356 is a frequency at which an envelope ENV1 of the RF pulse signal 356 switches between a low power level, e.g., PLVL1, etc., and a high power level, e.g., PLVL2, etc. For example, the pulsing frequency of the square-shaped pulse signal 356 is an inverse of a difference between a time T0 and the time t0. The envelope ENV1 is of a sinusoidal signal and forms a part of the square-shaped pulse signal 356 during the state S1.

The high power level LVL1 has power amounts that are greater than power amounts of the low power level LVL2. The high power level is defined between the envelope ENV1 having a rise transition RT1 and a fall transition FT1. The rise transition RT1 is a transition from the low power level PLVL1 to the high power level PLVL2. The fall transition FT1 is a transition from the high power level PLVL2 to the low power level PLVL1.

In some embodiments, the pulsing frequency of the RF generator 302 is received as a signal via the input device for setting by the processor 214. For example, the user selects an icon or a symbol on a graphical user interface displayed on a display device of the host system 210 via the input device to provide the signal indicating the pulsing frequency. Examples of a display device include a light emitting diode display, a liquid crystal display, a cathode ray tube display, and a plasma display.

Moreover, the processor 214 sets a slope parameter for modifying the square-shaped pulse signal 356, e.g., a parameter to determine a change in an angle of the square-shaped pulse signal 356, a parameter for determining a decrease in an angle of a rise transition or a fall transition of the square-shaped pulse signal 356, etc. In some embodiments, the slope parameter is received in the form of a signal via the input device for setting by the processor 214. For example, the user selects an icon or a symbol on a graphical user interface displayed on the display device of the host system 210 via the input device to provide the signal indicating the slope parameter. The slope parameter is set for achieving a rise transition RT2 and a fall transition FT2 of an envelope ENV2 of the RF pulse signal 354. The envelope ENV2 is of a sinusoidal signal and forms a part of the RF pulse signal 354 during the state S1. The rise transition RT2 is a transition from the low power level PLVL1 to the high power level PLVL2. The fall transition FT2 is a transition from the high power level PLVL2 to the low power level PLVL1.

The slope parameter defines a reduction in a rate of rise for the rise transition RT2 compared to a rate of rise for the rise transition RT1. The reduction in the rate of rise increases a rise time for the rise transition RT2 compared to a rise time for the rise transition RT1. For example, a rise time, e.g., a time between times t2 and t0 is greater than a rise time, e.g., a rise time at the time t0 or approximately at the time t0, etc. The slope parameter further defines a reduction in a rate of fall for the fall transition FT2 compared to a rate of fall for the fall transition FT1. The reduction in the rate of fall increases a fall time for the fall transition FT2 compared to a fall time for the fall transition FT1. For example, a fall time, e.g., a time between times t6 and t4 is greater than a fall time, e.g., a fall time at the time t6 or approximately at the time t6, etc. The reduction of the rate of rise and the rate of fall shapes a reduced pulse width PW1 of the envelope ENV2 at the high power level PLVL2. The pulse width PW1 is reduced compared to the pulsed width PW3 of the square-shaped pulse signal 356.

Moreover, the high power level PLVL2 has a shorter duration than the low power level PLVL1 during the pulsing frequency of the RF pulse signal 354. For example, the pulse width PW1 is shorter than a pulse width PW5 of the RF pulse signal 354 during the low power level PLVL1.

The RF pulse signal 354 is supplied to the lower electrode of the plasma chamber 206. When the RF pulse signal 354 is supplied to the lower electrode, an increase in low energy ions occurs during the rise transition RT2 and the fall transition FT2. Moreover, high ion energy is produced during the reduced pulse width PW1 of the envelope ENV2.

In some embodiments, the processor 214 sets, e.g., determines, identifies, etc., a shape of an RF pulse signal, e.g., a sinusoidal RF pulse signal, a bell-shaped RF pulse signal, an exponential RF pulse signal, etc. The shape of the RF pulse signal includes a shape of a rise transition, a fall transition of the RF pulse signal, and/or a steady state between the rise transition and the fall transition. In some embodiments, the shape of an RF pulse signal is received as a signal via the input device. For example, the user selects an icon or a symbol on a graphical user interface displayed on the display device of the host system 210 via the input device to provide the signal regarding the shape of the RF pulse signal.

It should be noted that the RF pulse signal 354 has a radio frequency, which is different from a frequency of the envelope ENV2. For example, the radio frequency is a frequency of a sinusoidal signal and is greater than a frequency of the envelope ENV2 of the sinusoidal signal.

Figure 4A:
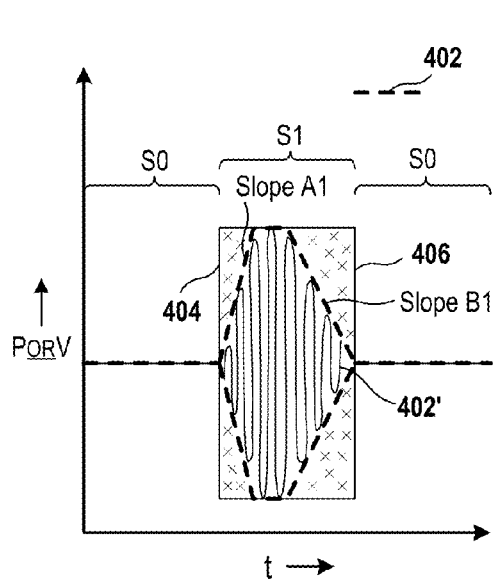
FIG. 4A plots a power or a voltage of an RF pulse signal versus time, in accordance with an embodiment described in the present disclosure.
Figure 4B:
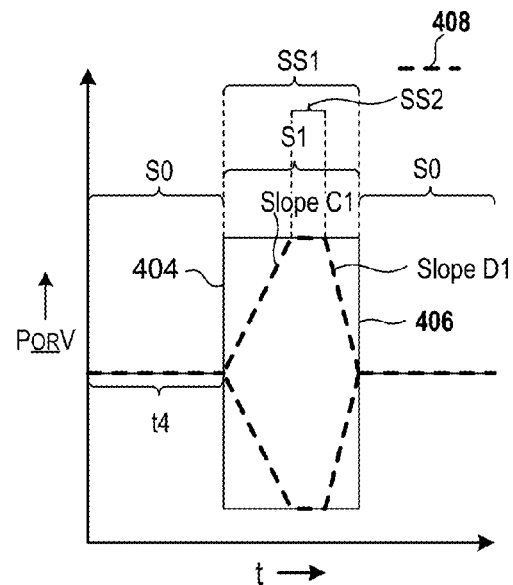
FIG. 4B plots a power or a voltage of an RF pulse signal in which a rise transition slope is greater than a fall transition slope, in accordance with an embodiment described in the present disclosure.
Figure 4C:
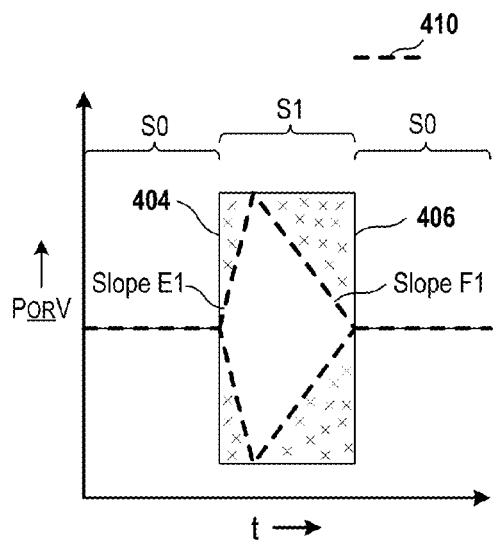
FIG. 4C is a diagram of a plot of power or voltage of an RF pulse signal versus time, in accordance with an embodiment described in the present disclosure.
Figure 4D:
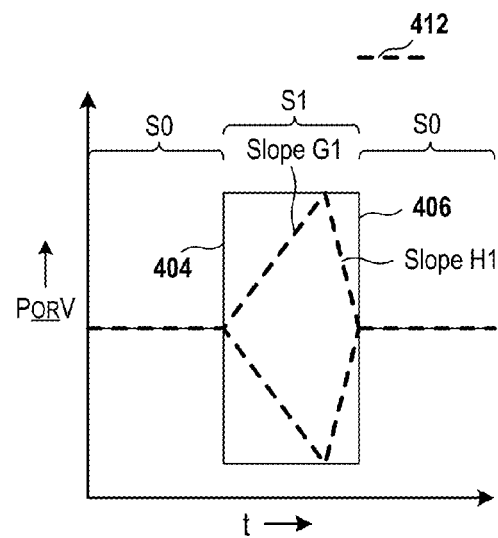
FIG. 4D is a diagram of a plot of power or voltage of an RF pulse signal versus time, in accordance with an embodiment described in the present disclosure.
Figure 4E:
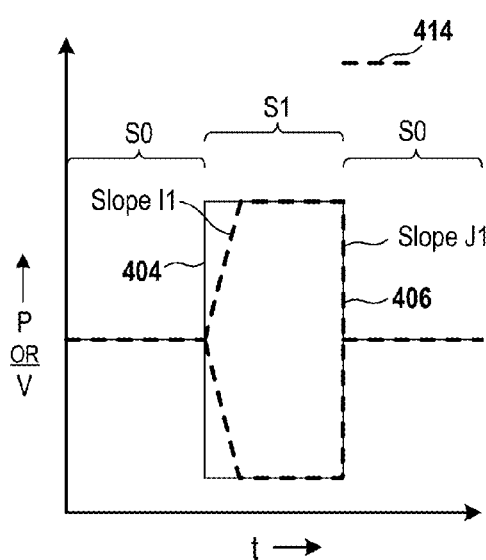
FIG. 4E is a diagram of a plot of power or voltage of an RF pulse signal versus time, in accordance with an embodiment described in the present disclosure.
Figure 4F:
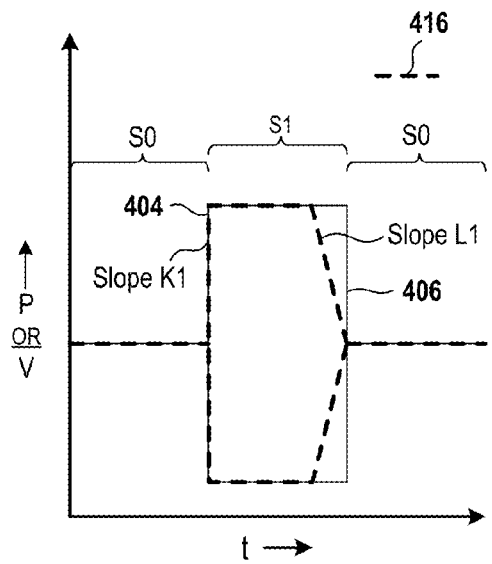
FIG. 4F is a diagram of a plot of power or voltage of an RF pulse signal versus time, in accordance with an embodiment described in the present disclosure.
Figure 4G:
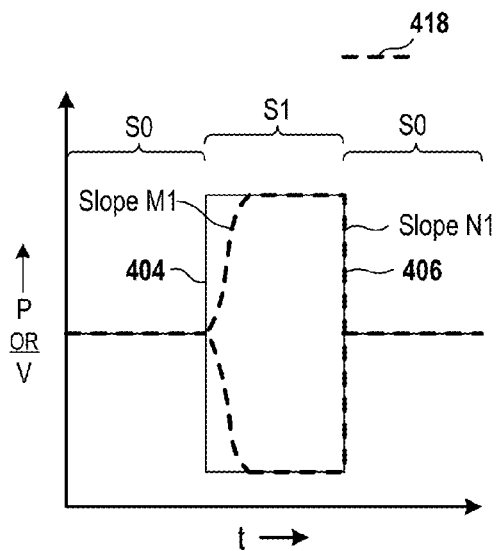
FIG. 4G is a diagram of a plot of power or voltage of an RF pulse signal versus time, in accordance with an embodiment described in the present disclosure.
Figure 4H:
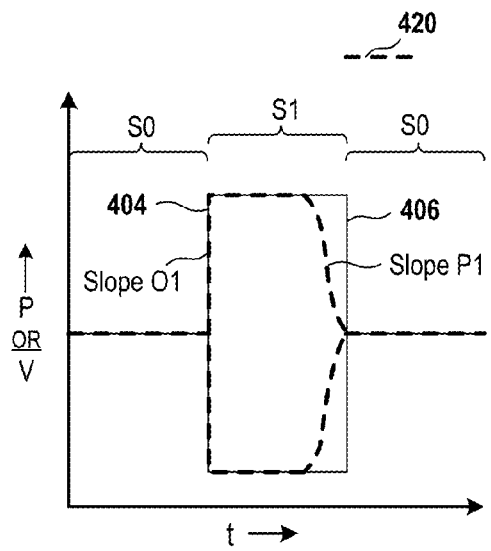
FIG. 4H is a diagram of a plot of power or voltage of an RF pulse signal versus time, in accordance with an embodiment described in the present disclosure.
Figure 4I:
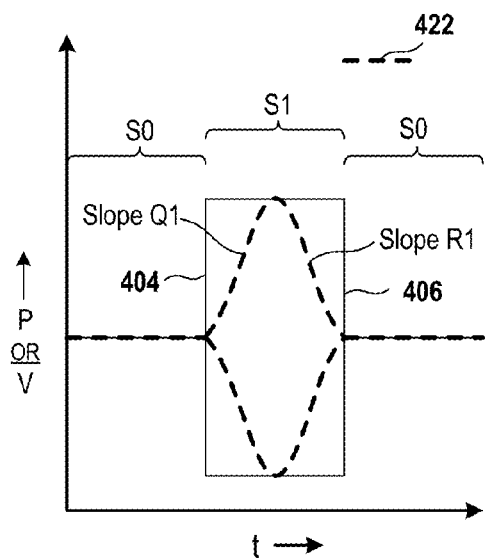
FIG. 4I is a diagram of a plot of power or voltage of an RF pulse signal versus time, in accordance with an embodiment described in the present disclosure.
Figure 4J:
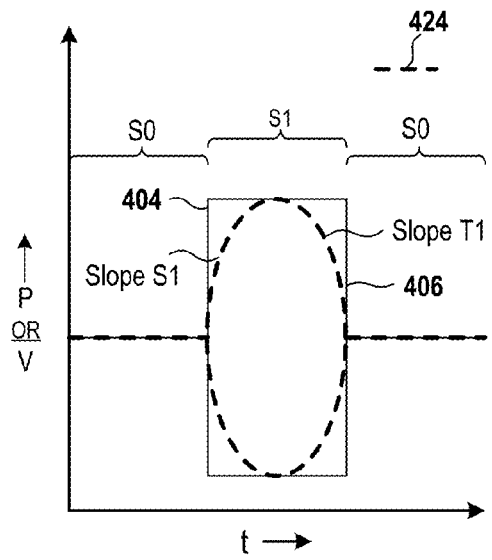
FIG. 4J is a diagram of a plot of power or voltage of an RF pulse signal versus time, in accordance with an embodiment described in the present disclosure.
Figure 4K:
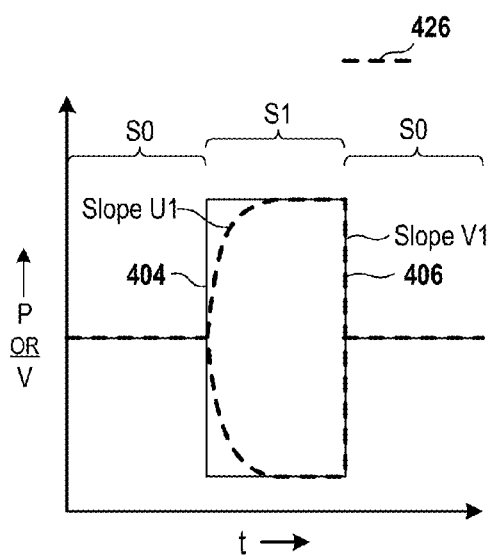
FIG. 4K is a diagram of a plot of power or voltage of an RF pulse signal versus time, in accordance with an embodiment described in the present disclosure.
Figure 4L:
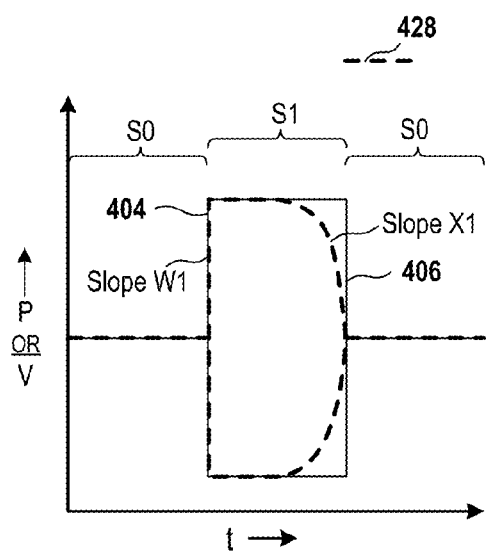
FIG. 4L is a diagram of a plot of power or voltage of an RF pulse signal versus time, in accordance with an embodiment described in the present disclosure.
Figure 4M:
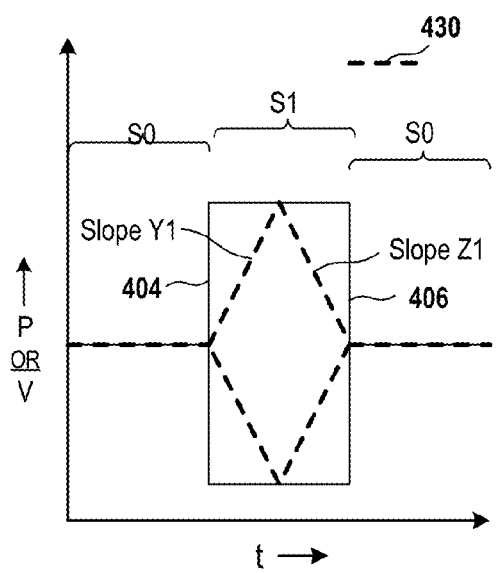
FIG. 4M is a diagram of a plot of power or voltage of an RF pulse signal versus time, in accordance with an embodiment described in the present disclosure.
Figure 4N:
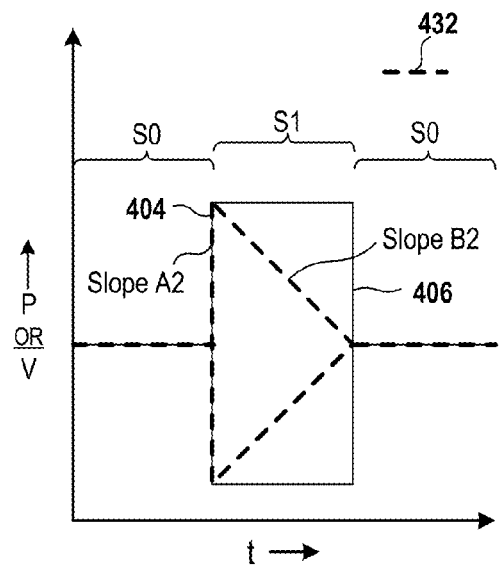
FIG. 4N is a diagram of a plot of power or voltage of an RF pulse signal versus time, in accordance with an embodiment described in the present disclosure.
Figure 4O:
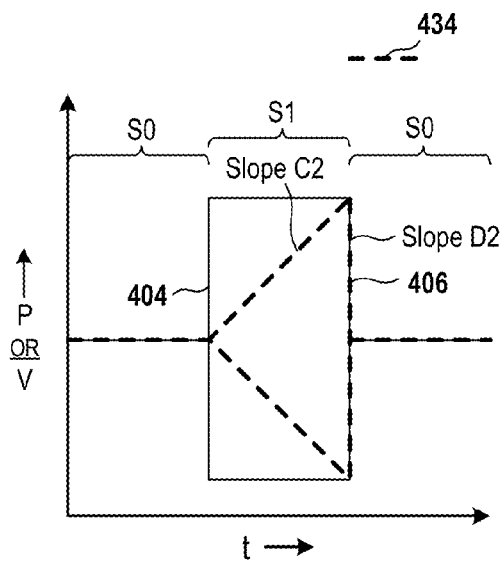
FIG. 4O is a diagram of a plot of power or voltage of an RF pulse signal versus time, in accordance with an embodiment described in the present disclosure.
Figure 4P:
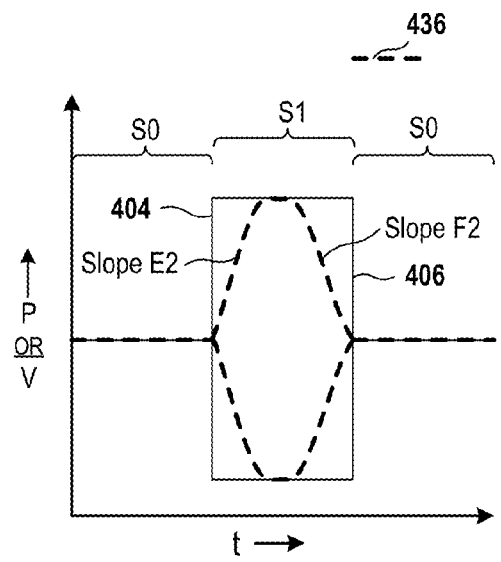
FIG. 4P is a diagram of a plot of power or voltage of an RF pulse signal versus time, in accordance with an embodiment described in the present disclosure.
Figure 4Q:
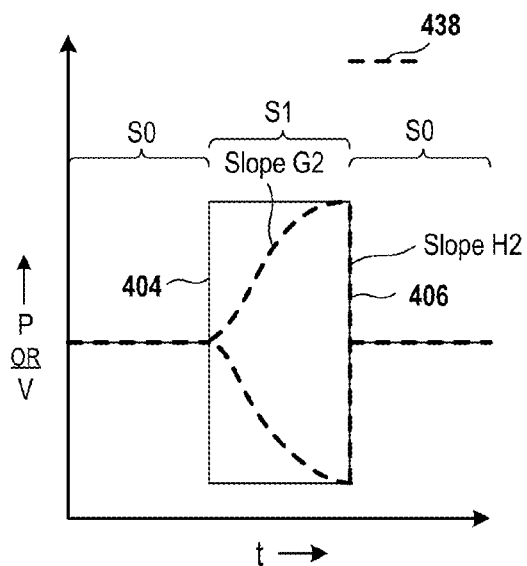
FIG. 4Q is a diagram of a plot of power or voltage of an RF pulse signal versus time, in accordance with an embodiment described in the present disclosure.
Figure 4R:
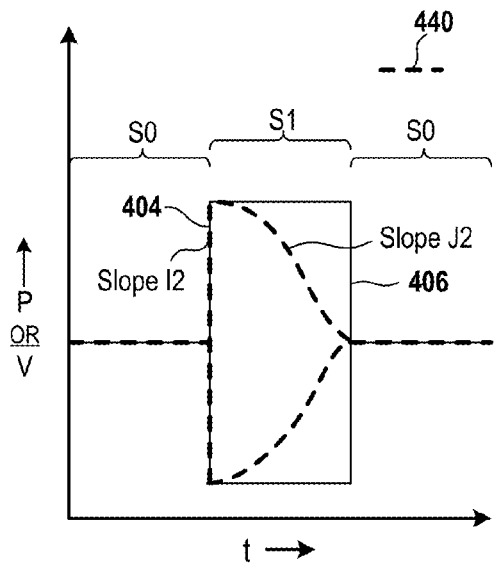
FIG. 4R is a diagram of a plot of power or voltage of an RF pulse signal versus time, in accordance with an embodiment described in the present disclosure.
Figure 4S:
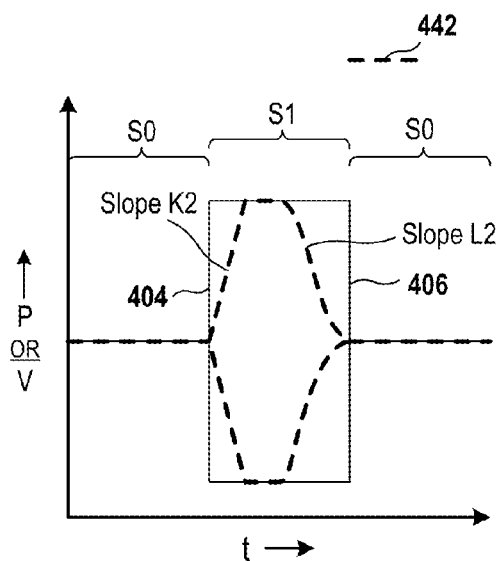
FIG. 4S is a diagram of a plot of power or voltage of an RF pulse signal versus time, in accordance with an embodiment described in the present disclosure.
Figure 4T:
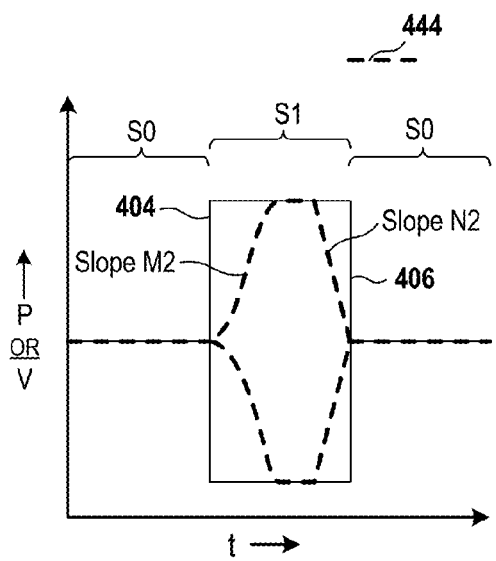
FIG. 4T is a diagram of a plot of power or voltage of an RF pulse signal versus time, in accordance with an embodiment described in the present disclosure.
Figure 4U:
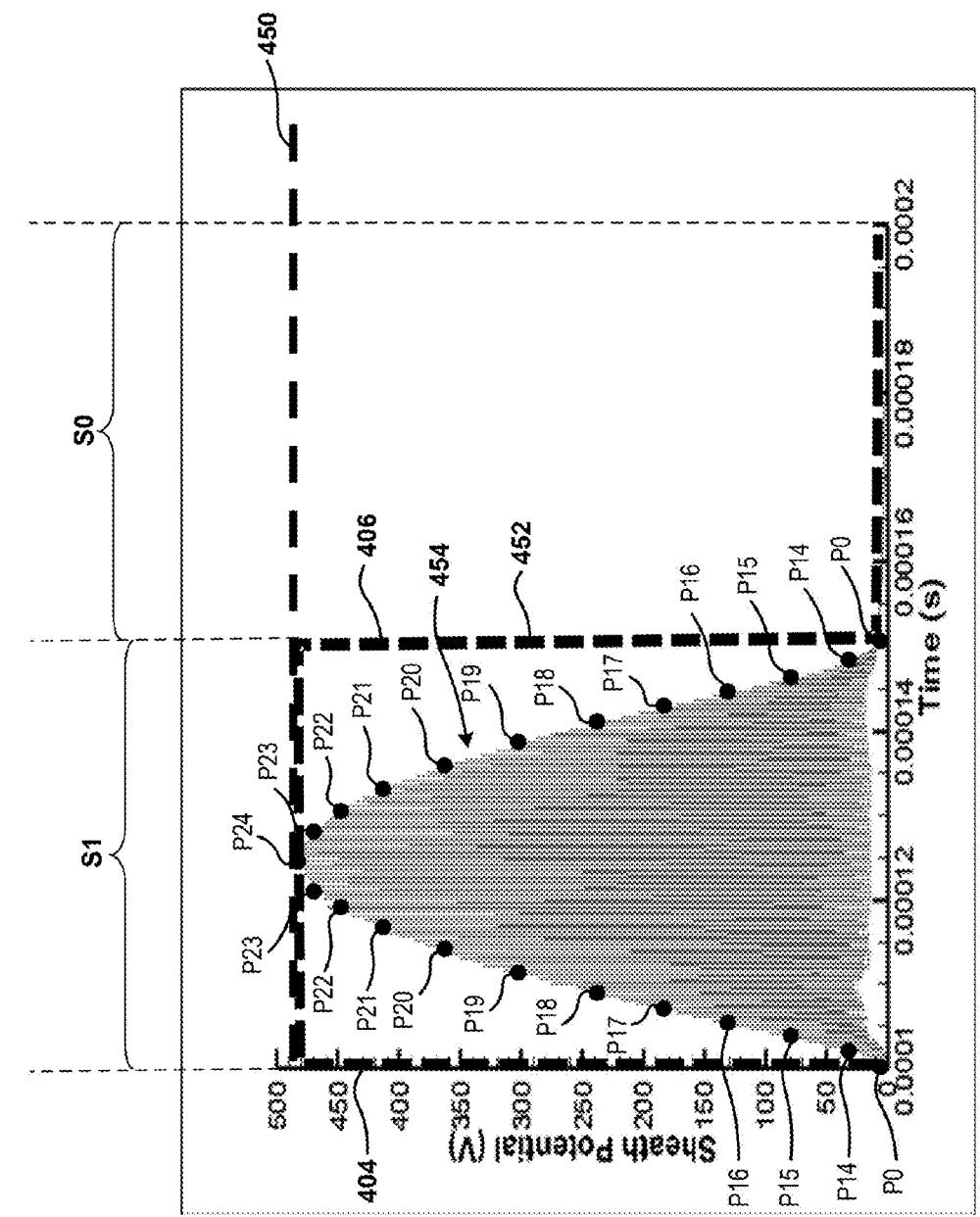
FIG. 4U is a diagram of a plot of voltage versus time, in accordance with an embodiment described in the present disclosure.

FIGS. 4A-4U are embodiments of graphs to illustrate various shapes of envelopes of RF pulse signals. For example, in FIG. 4A, which plots a power or a voltage of an RF pulse signal 402 versus time t, an envelope of the RF pulse signal 402 has a polygonal shape. An example of an envelope of an RF pulse signal includes amplitudes of the RF pulse signal. The RF pulse signal 402 is an example of an RF pulse signal generated by the RF generator 302 (FIG. 3A).

As shown, the RF pulse signal 402 is an envelope of an RF pulse signal 402', which has a sinusoidal shape and is generated by the RF generator 302 (FIG. 3A). Similarly, the RF pulse signals, e.g., the RF pulse signal 352, the RF pulse signal 354, the RF pulse signal 356, (FIG. 3C), etc., described herein are envelopes of corresponding sinusoidal RF pulse signals that are generated by the RF generator 302.

A rise transition slope A1 of the RF pulse signal 402 during the state S1 is greater than a fall transition slope B1 during the state S1 of the RF pulse signal 402 during the state S1. A rise time of the rise transition slope A1 is less than a fall time of the fall transition slope B1.

The rise transition slope A1 during the state S1 is less than a substantially infinite slope 404 of a square-shaped pulse signal and the fall transition slope B1 during the state S1 is less than a substantially infinite slope 406 of the square-shaped pulse signal. The reduction in slopes facilitates generation of low-energy ions and reduction of high-energy ions, illustrated using "x"s, etc., in FIG. 4A, during processing of the substrate stack 100 (FIG. 1).

Moreover, the slope A1 does not intersect the slope B1.

FIG. 4B plots a power or a voltage of an RF pulse signal 408 in which a rise transition slope C1 is greater than a fall transition slope D1. The RF pulse signal 408 is an example of an RF pulse signal generated by the RF generator 302 (FIG. 3A). A rise time of the RF pulse signal 408 during the state S1 is greater than a fall time of the RF pulse signal 408.

Moreover, the slope C1 does not intersect the slope D1. Also, a time period for a steady state SS2 of the state S1 of the RF pulse signal 408 is less than a time period for a steady state SS1 of the state S1 of the square-shaped pulse signal.

FIG. 4C is a diagram of an embodiment of a plot of power or voltage of an RF pulse signal 410 versus time t. The RF pulse signal 410 is an example of an RF pulse signal generated by the RF generator 302 (FIG. 3A). A rise transition slope E1 of the RF pulse signal 410 is less than a fall transition slope F1 of the RF pulse signal 410. The slope E1 is less than the slope 404 of a square-shaped pulse signal and the slope F1 is less than the slope 406 to reduce an amount of high-energy ions, indicated by "x"s, and to increase an amount of low-energy ions during a state S1 of the RF pulse signal 410.

Moreover, the slope E1 intersects the slope F1.

FIG. 4D is a diagram of an embodiment of a plot of power or voltage of an RF pulse signal 412 versus time t. The RF pulse signal 412 is an example of an RF pulse signal generated by the RF generator 302 (FIG. 3A). A rise transition slope G1 of the RF pulse signal 412 is greater than a fall transition slope H1 of the RF pulse signal 412.

Moreover, the slope G1 intersects the slope H1.

FIG. 4E is a diagram of an embodiment of a plot of power or voltage of an RF pulse signal 414 versus time t. The RF pulse signal 414 is an example of an RF pulse signal generated by the RF generator 302 (FIG. 3A). A rise transition slope I1 of the RF pulse signal 414 is less than a substantially infinite slope J1 during a fall time of the RF pulse signal 414. Also, a fall transition slope J1 is the same or substantially similar to a the slope 406, which is substantially infinite.

FIG. 4F is a diagram of an embodiment of a plot of power or voltage of an RF pulse signal 416 versus time t. The RF pulse signal 416 is an example of an RF pulse signal generated by the RF generator 302 (FIG. 3A). A substantially infinite slope K1 during a rise transition of the RF pulse signal 416 is greater than a fall transition slope L1 of the RF pulse signal 416.

FIG. 4G is a diagram of an embodiment of a plot of power or voltage of an RF pulse signal 418 versus time t. The RF pulse signal 418 is an example of an RF pulse signal generated by the RF generator 302 (FIG. 3A). A substantially infinite slope N1 during a fall transition of the RF pulse signal 418 is greater than a rise transition slope M1 of the RF pulse signal 418. It should be noted that a shape of the RF pulse signal 418 during a rise time of the state S1 is curved, e.g., sinusoidal, etc. For example, the slope M1 is varying, e.g., not constant, etc., during a rise time of the RF pulse signal 418.

FIG. 4H is a diagram of an embodiment of a plot of power or voltage of an RF pulse signal 420 versus time t. The RF pulse signal 420 is an example of an RF pulse signal generated by the RF generator 302 (FIG. 3A). A substantially infinite slope O1 during a rise transition of the RF pulse signal 420 is greater than a fall transition slope P1 of the RF pulse signal 420. It should be noted that a shape of the RF pulse signal 420 during a fall time of the state S1 is curved, e.g., sinusoidal, etc. For example, the slope P1 is varying, e.g., not constant, etc., during a fall time of the RF pulse signal 420.

FIG. 4I is a diagram of an embodiment of a plot of power or voltage of an RF pulse signal 422 versus time t. The RF pulse signal 422 is an example of an RF pulse signal generated by the RF generator 302 (FIG. 3A). A rise transition slope Q1 is opposite of, e.g., has an opposite direction, etc., and has a same magnitude as that of a fall transition slope R1 of the RF pulse signal 422. The RF pulse signal 422 is curved, e.g., sinusoidal, etc, during both rise and fall times. For example, both the slopes Q1 and R1 are varying. Also, the slope Q1 intersects the slope R1.

FIG. 4J is a diagram of an embodiment of a plot of power or voltage of an RF pulse signal 424 versus time t. The RF pulse signal 424 is an example of an RF pulse signal generated by the RF generator 302 (FIG. 3A). A rise transition slope S1 is opposite of, e.g., has an opposite direction, etc., and has a same magnitude as that of a fall transition slope T1 of the RF pulse signal 424. The RF pulse signal 424 is curved, e.g., bell-shaped, exponential shape, etc, during both rise and fall times. For example, both the slopes S1 and T1 are varying. Also, the slope S1 intersects the slope T1.

FIG. 4K is a diagram of an embodiment of a plot of power or voltage of an RF pulse signal 426 versus time t. The RF pulse signal 426 is an example of an RF pulse signal generated by the RF generator 302 (FIG. 3A). A substantially infinite slope V1 during a fall transition of the RF pulse signal 426 is greater than a rise transition slope U1 of the RF pulse signal 426. It should be noted that a shape of the RF pulse signal 426 during a rise time of the state S1 is curved, e.g., bell-shaped, exponential shape, etc. For example, the slope U1 is varying, e.g., not constant, etc., during a rise time of the RF pulse signal 426. There is a steady state during the state S1 between the slopes U1 and V1.

FIG. 4L is a diagram of an embodiment of a plot of power or voltage of an RF pulse signal 428 versus time t. The RF pulse signal 428 is an example of an RF pulse signal generated by the RF generator 302 (FIG. 3A). A substantially infinite slope W1 during a rise transition of the RF pulse signal 428 is greater than a fall transition slope X1 of the RF pulse signal 428. It should be noted that a shape of the RF pulse signal 428 during a fall time of the state S1 is curved, e.g., bell-shaped, exponential shape, etc. For example, the slope X1 is varying, e.g., not constant, etc., during a fall time of the RF pulse signal 428. There is a steady state during the state S1 between the slopes W1 and X1.

FIG. 4M is a diagram of an embodiment of a plot of power or voltage of an RF pulse signal 430 versus time t. The RF pulse signal 430 is an example of an RF pulse signal generated by the RF generator 302 (FIG. 3A). A rise transition slope Y1 of the RF pulse signal 430 is the same in magnitude but opposite in direction compared to a fall transition slope Z1 of the RF pulse signal 430. The slope Y1 is less than the slope 404 of a square-shaped pulse signal and the slope Z1 is less than the slope 406 of the square-shaped pulse signal to reduce an amount of high-energy ions and to increase an amount of low-energy ions during a state S1 of the RF pulse signal 430. Both the slopes Y1 and Z1 form a straight line or a substantially straight line.

Moreover, the slope Y1 intersects the slope Z1.

FIG. 4N is a diagram of an embodiment of a plot of power or voltage of an RF pulse signal 432 versus time t. The RF pulse signal 432 is an example of an RF pulse signal generated by the RF generator 302 (FIG. 3A). A substantially infinite slope A2 during a rise transition of the RF pulse signal 432 is greater than a fall transition slope B2 of the RF pulse signal 432.

FIG. 4O is a diagram of an embodiment of a plot of power or voltage of an RF pulse signal 434 versus time t. The RF pulse signal 434 is an example of an RF pulse signal generated by the RF generator 302 (FIG. 3A). A substantially infinite slope D2 during a fall transition of the RF pulse signal 434 is greater than a rise transition slope C2 of the RF pulse signal 434.

FIG. 4P is a diagram of an embodiment of a plot of power or voltage of an RF pulse signal 436 versus time t. The RF pulse signal 436 is an example of an RF pulse signal generated by the RF generator 302 (FIG. 3A). A rise transition slope E2 of the RF pulse signal 436 is the same in magnitude but opposite in direction compared to a fall transition slope F2 of the RF pulse signal 436. Each of the slopes E2 and F2 are varying, e.g., has a sinusoidal shape, is not constant, etc. There is a steady state of the state S1 between the slopes E2 and F2.

FIG. 4Q is a diagram of an embodiment of a plot of power or voltage of an RF pulse signal 438 versus time t. The RF pulse signal 438 is an example of an RF pulse signal generated by the RF generator 302 (FIG. 3A). A substantially infinite slope H2 during a fall transition of the RF pulse signal 438 is greater than a rise transition slope G2 of the RF pulse signal 438. Moreover, the slope G2 is curved, e.g., is varying, has a sinusoidal shape, etc.

FIG. 4R is a diagram of an embodiment of a plot of power or voltage of an RF pulse signal 440 versus time t. The RF pulse signal 440 is an example of an RF pulse signal generated by the RF generator 302 (FIG. 3A). A substantially infinite slope I2 during a rise transition of the RF pulse signal 440 is greater than a fall transition slope J2 of the RF pulse signal 440. Moreover, the slope J2 is curved, e.g., is varying, has a sinusoidal shape, etc.

FIG. 4S is a diagram of an embodiment of a plot of power or voltage of an RF pulse signal 442 versus time t. The RF pulse signal 442 is an example of an RF pulse signal generated by the RF generator 302 (FIG. 3A). A rise time slope K2 of the RF pulse signal 442 is constant, e.g., forms a straight line, etc. or is substantially constant, e.g., forms a substantially straight line, etc., and a fall transition slope L2 of the RF pulse signal 442 is varying, e.g., is sinusoidal, etc. In some embodiments, a rise transition slope of the RF pulse signal 442 is curved, e.g., has a bell shape, is exponentially increasing, etc.

FIG. 4T is a diagram of an embodiment of a plot of power or voltage of an RF pulse signal 444 versus time t. The RF pulse signal 444 is an example of an RF pulse signal generated by the RF generator 302 (FIG. 3A). A rise time slope M2 of the RF pulse signal 444 is varying, e.g., is sinusoidal, etc., and a fall transition slope N2 of the RF pulse signal 444 is constant or substantially constant. In some embodiments, a fall transition slope of the RF pulse signal 444 is curved, e.g., has a bell shape, is exponentially decreasing, etc.

In each of FIGS. 4A-4T, a steady state during the state S1 of an RF pulse signal illustrated using dashed lines is less than a steady state during the state S1 of a square-shaped pulse signal. Moreover, RF pulse signals are shown as dashed lines in each of FIGS. 4A-4T and square-shaped pulse signals are shown as solid lines in each of FIGS. 4A-4T. Also, a steady state during the state S1 of the RF pulse signals shown using dashed lines in each of FIGS. 4A-4T occurs for a lesser time than a steady-state of a square-shaped pulse.

FIG. 4U is a diagram of an embodiment of a plot of voltage versus time t. The plot includes a continuous wave (CW) RF signal 450, a square-shaped RF signal 452, and an RF pulse signal 454. In some embodiments, a continuous wave RF signal has one state instead of two or more states. As an example, a continuous wave RF signal has the state S1 or the state S0. As another example, a continuous wave RF signal is not pulsed.

The RF pulse signal 454 generates a higher number of low-energy ions during the state S1 than that generated by the square-shaped RF signal 452 and the continuous wave RF signal 450 during the state S1. The higher number of low-energy ions improves a processing operation of the substrate stack 100 (FIG. 1).

In each of FIGS. 4A-4U, a rise transition slope is for achieving a steady state during the state S1 from the state S0 and a fall transition slope is for achieving a steady state during the state S0 from the state S1.

FIG. 5A is an embodiment of a graph 508 to illustrate pulse rise times and pulse fall times of square-shaped RF signals 510 and 512 that have substantially infinite slopes. The graph 508 plots voltage (V) versus time t. The square-shaped RF signal 510 is generated by the y or z MHz RF generator and the square-shaped RF signal 512 is generated by the x MHz RF generator. The square-shaped RF signal 510 has a substantially infinite slope during a rise time from the state S0 to the state S1 and has a substantially infinite slope during a fall time from the state S1 to the state S0. Similarly, the square-shaped RF signal 512 has a substantially infinite slope during a rise time and has a substantially infinite slope during a fall time. For example, a rise time of each of the square-shaped RF signals 510 and 512 is 5 microseconds or approximately 5 microseconds and a fall time of each of the square-shaped RF signals 510 and 512 is 5 microseconds or approximately 5 microseconds.

FIG. 5B is an embodiment of a graph 502 to illustrate pulse rise times and pulse fall times of an RF pulse signals 516 and 518 that have other than substantially infinite slopes during rise and fall transitions. The graph 502 plots voltage versus time t. The RF pulse signal 518 is generated by the y or z MHz RF generator and the RF pulse signal 516 is generated by the x MHz RF generator. The RF pulse signal 516 has other than a substantially infinite slope during a rise time from the state S0 to the state S1 and has other than a substantially infinite slope during a fall time from the state S1 to the state S0. Similarly, the RF pulse signal 518 has other than a substantially infinite slope during a rise time and has other than substantially infinite slope during a fall time. For example, a rise time of each of the RF pulse signals 516 and 518 is 25 microseconds or approximately 25 microseconds and a fall time of each of the RF pulse signals 516 and 518 is 25 microseconds or approximately 25 microseconds.

FIG. 5C is an embodiment of a graph 504 that plots voltage versus time t to illustrate pulse rise times and pulse fall times of an RF pulse signals 506 and 520 that have other than substantially infinite slopes. For example, a rise time of each of the RF pulse signals 506 and 520 is 50 microseconds and a fall time of each of the RF pulse signals 506 and 520 is 50 microseconds and a pulse width of each of the RF pulse signals 506 and 520 is 150 microseconds. The RF pulse signal 506 is generated by the y or z MHz RF generator and the RF pulse signal 520 is generated by the x MHz RF generator.

Figure 6A:
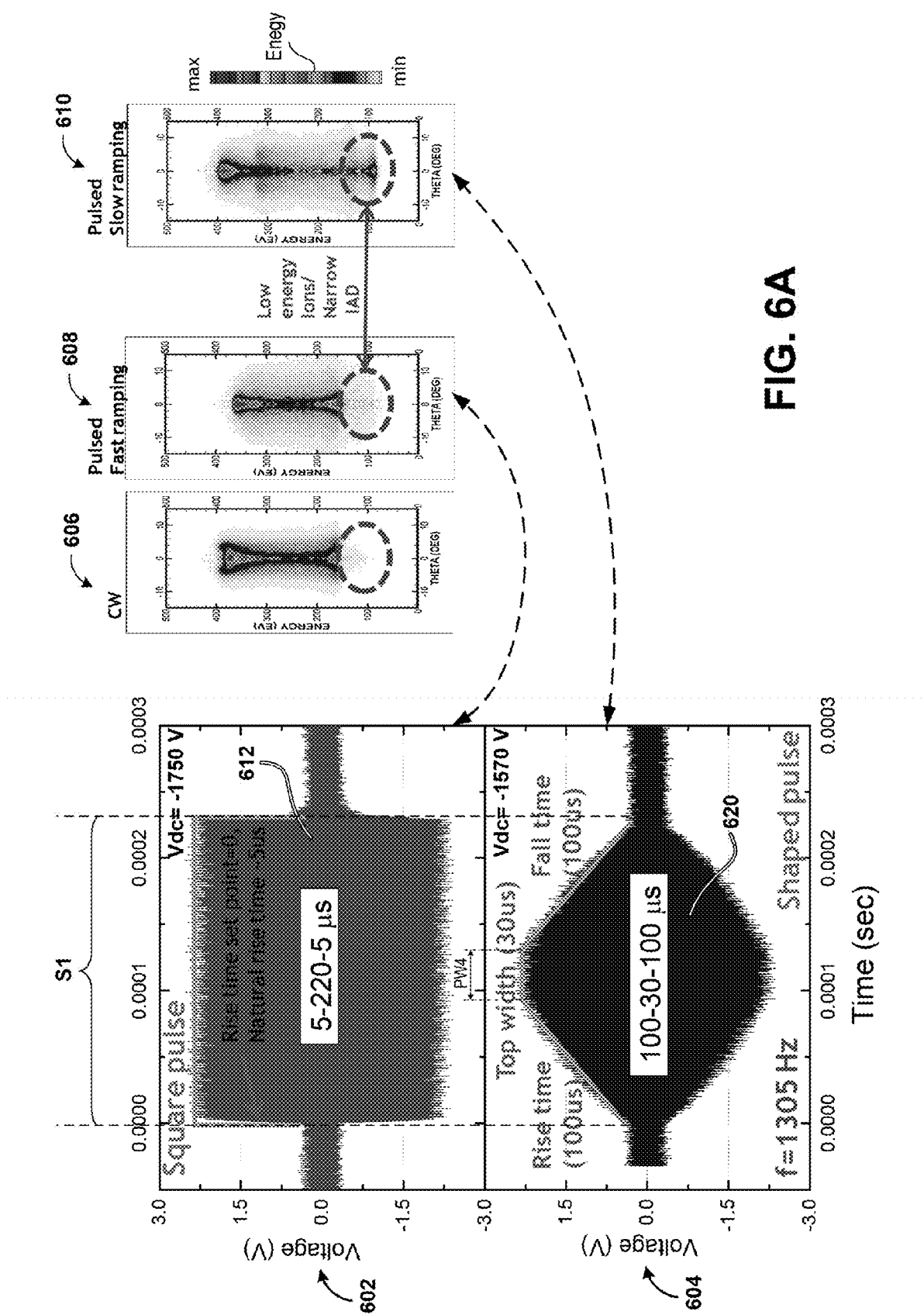
FIG. 6A is a diagram of multiple plots to illustrate an increase in a number of low-energy ions with an increase in a rise time and/or an increase in a fall time of an RF pulse signal, in accordance with an embodiment described in the present disclosure.

FIG. 6A is a diagram of an embodiment of multiple plots 602, 604, 606, 608, and 610 to illustrate an increase in a number of low-energy ions with an increase in a rise transition time and/or an increase in a fall transition time of an RF pulse signal compared to a transition time of a square-shaped pulse signal 612. The plot 602 plots a voltage of the square-shaped RF pulse signal 612 versus time t. The square-shaped pulse signal 612 has a substantial infinite slope during a rise time and has a substantially infinite slope during a fall time. For example, the square-shaped pulse signal has a rise time of 5 microseconds, a steady state time of 220 microseconds, and a fall time of 5 microseconds. As another example, the square-shaped pulse signal has a rise time of approximately 5 microseconds, a steady state time of approximately 220 microseconds, and a fall time of approximately 5 microseconds.

Moreover, the plot 604 plots a graph of voltage of an RF pulse signal 620 versus time t. A rise time of the RF pulse signal 620 is greater than a rise time of the square-shaped RF pulse signal 612 and a fall time of the RF pulse signal 620 is greater than a rise time of the square-shaped RF pulse signal 612. Moreover, a pulse width time period of the RF pulse signal 620 is less than a pulse width time period of the square-shaped RF pulse signal 612. For example, the RF pulse signal 620 has a pulse width of PW4 during a steady state of the state S1 of 30 microseconds, has a fall time of 100 microseconds, and has a rise time of 100 microseconds. As another example, the RF pulse signal 620 has a pulse width of PW4 during a steady state of the state S1 of approximately 30 microseconds, has a fall time of approximately 100 microseconds, and has a rise time of approximately 100 microseconds.

Each plot 606, 608, and 610 is a plot of an ion energy distribution. For example, the each plot 606, 608, and 610 is a graph of ion energy of ions that are generated by plasma in the plasma chamber 206 (FIG. 2) versus angle theta, measured in degrees at which the ions are incident on the contact hole 102 (FIG. 1). The plot 606 is generated based on an application of a continuous wave RF signal to the chuck 215 (FIG. 2) of the plasma chamber 206. The plot 608 is generated based on an application of the square-shaped RF pulse signal 612 to the chuck 215. The plot 610 is generated based on an application of an RF pulse signal 620 having a rise transition slope other than substantial infinite and a fall transition slope other than substantial infinite.

As shown by dashed elliptical portions in the plots 608 and 610, a number of low-energy ions of plasma as shown in the plot 610 is greater than a number of low-energy ions of plasma shown in the plot 608. Moreover, as shown by dashed elliptical portions in the plots 606 and 608, a number of low-energy ions of plasma shown in the plot 608 is greater than a number of low-energy ions of plasma shown in the plot 606.

Figure 6B:
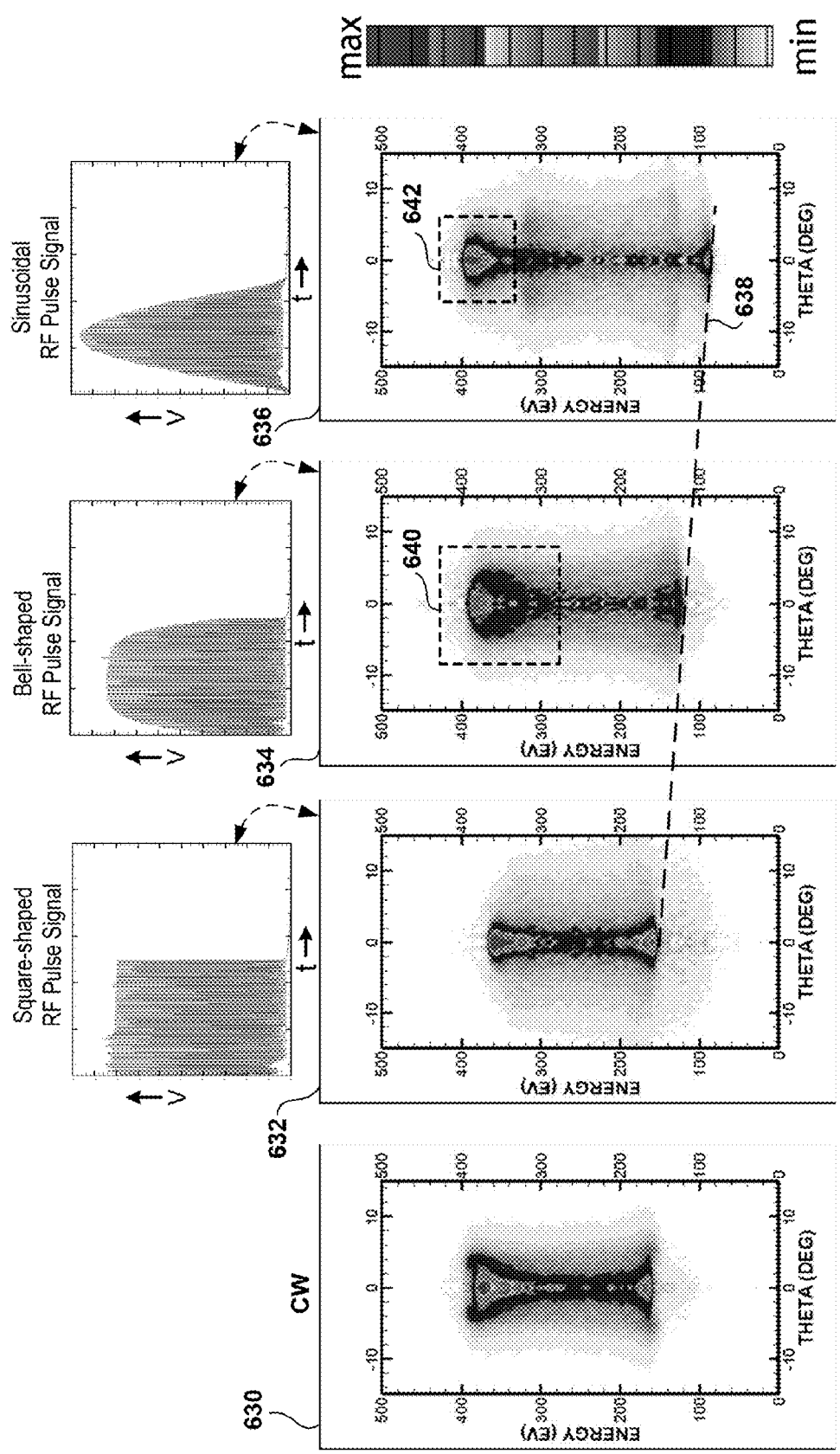
FIG. 6B is a diagram showing multiple plots to illustrate an increase a number of low-energy ions with a change in shapes of RF pulse signals, in accordance with an embodiment described in the present disclosure.

FIG. 6B is an embodiment of a diagram showing multiple plots 630, 632, 634, and 636 to illustrate an increase a number of low-energy ions with a change in shapes of RF pulse signals. The plot 630 is an ion energy distribution that occurs in the plasma chamber 206 (FIG. 1) when a continuous wave RF signal is applied to the chuck 215 (FIG. 2). Moreover, the plot 632 is an ion energy distribution that occurs in the plasma chamber 206 when a square-shaped RF pulse signal is applied to the chuck 215. The plot 634 is an ion energy distribution that occurs in the plasma chamber 206 when a curved, e.g., bell-shaped, exponential, etc., RF pulse signal is applied to the chuck 215. Also, the plot 636 is an ion energy distribution that occurs in the plasma chamber 206 when a curved, e.g., sinusoidal, etc., RF pulse signal is applied to the chuck 215. As shown by a dashed line 638, a number of low-energy ions within plasma generated in the plasma chamber 206 increases with a change in a shape of an RF pulse signal from square-shaped to bell-shaped or exponential and further to sinusoidal shape.

Moreover, as shown by regions 640 and 642, ion flux at the contact hole 102 (FIG. 1) is focused when the sinusoidal-shaped RF pulse signal is applied to the chuck 215 to create the ion energy.

In various embodiments, a shape of an RF pulse signal is optimized to increase an amount of low-energy ions and/or to increase a focus of ion flux on the contact hole 102. For example, an ion energy distribution measurement device (IEMD) (not shown), e.g., a retarding field energy analyzer, a mass spectrometer, etc., is connected to or placed within the plasma chamber 206 to measure an ion energy distribution of plasma within the plasma chamber 206. The IEMD is also connected to the processor 214 (FIG. 2). The processor 214 receives an ion energy distribution from the IEMD and determines whether ion energy in the ion energy distribution is greater than a pre-determined threshold. Upon determining that the ion energy is greater than the pre-determined threshold, the processor 214 determines to change a shape of an RF pulse, e.g., from bell-shaped to sinusoidal, from exponential to sinusoidal, from square-shaped to an RF pulse having a slope other than a substantial infinite slope, etc., to decrease an amount of ion energy to further increase an amount of low-energy ions in plasma within the plasma chamber 206 and to increase a focus of ion energy within the plasma. In some embodiments, the ion energy is decreased iteratively by changing a shape of the slope until an amount of the ion energy is less than the pre-determined threshold.

In some embodiments, upon determining that the ion energy is greater than the pre-determined threshold, the processor 214 determines to change a transition time associated with a slope, e.g., a rise transition slope, a fall transition slope, etc., of an RF pulse signal to reduce an amount of the ion energy and to increase a focus of ion flux within the plasma. In some embodiments, the ion energy is decreased iteratively by changing the slope until an amount of the ion energy is less than the pre-determined threshold. In various embodiments, a change in a slope of an RF pulse changes a duty cycle of the RF pulse for a constant duty cycle of the clock signal.

Figure 6C:
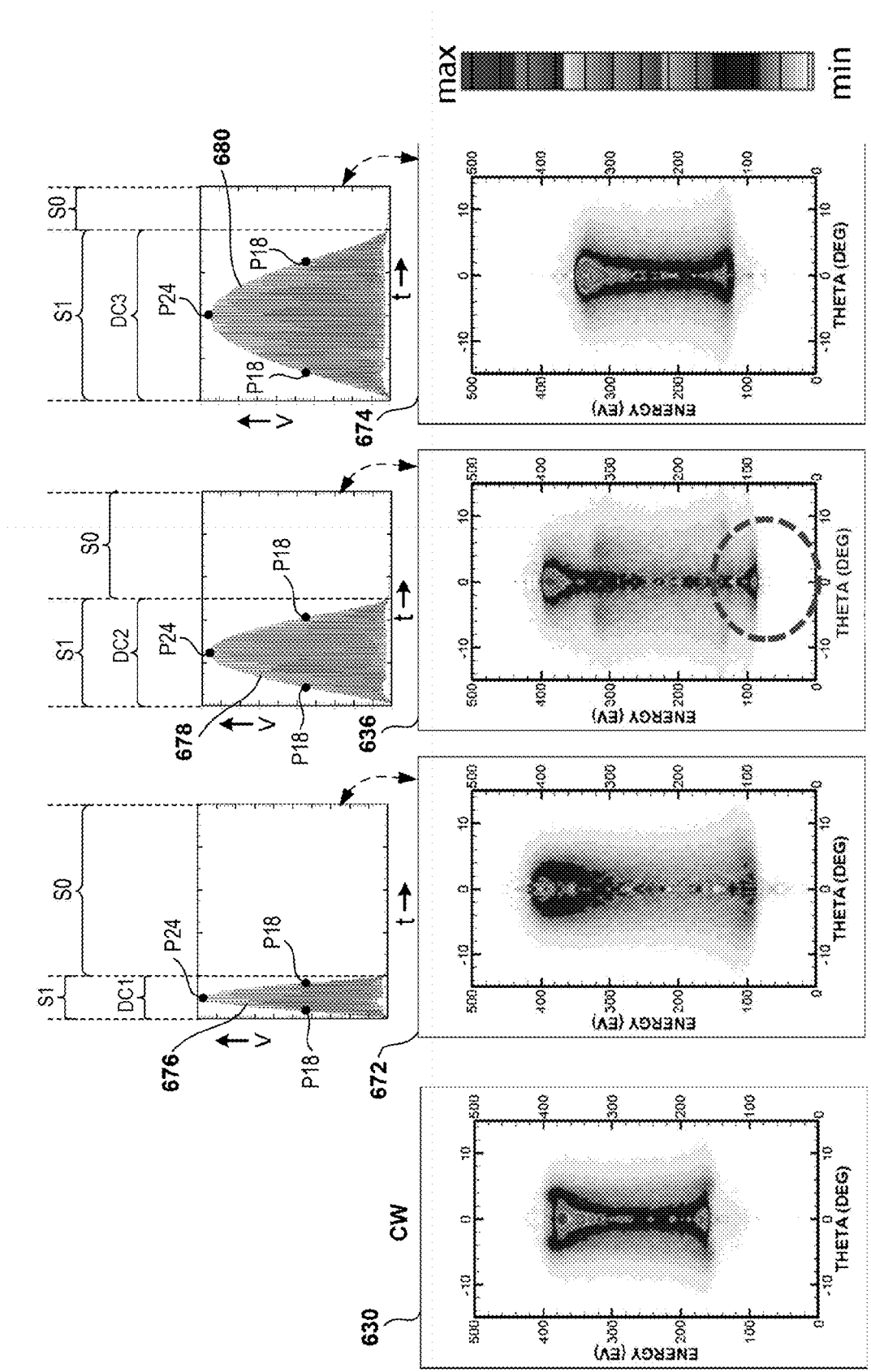
FIG. 6C illustrates different plots to illustrate a change in ion energy distribution with a change in a duty cycle of an RF pulse signal, in accordance with an embodiment described in the present disclosure.

FIG. 6C is an embodiment of different plots 630, 672, 636, and 674 to illustrate a change in ion energy distribution with a change in a duty cycle of an RF pulse signal. The plot 672 is generated when an RF pulse signal 676 is provided to the chuck 215 (FIG. 2). The RF pulse signal 676 has a duty cycle DC1 that is less than a duty cycle DC2 of an RF pulse signal 678. For example, a state S1 of the RF pulse signal 676 occurs for a shorter time period than a state S1 of the RF pulse signal 678 and a state S0 of the RF pulse signal 678 occurs for a longer time period than a state of the RF pulse signal 676. As another example, a duty cycle of the RF pulse signal 678 is 50% and a duty cycle of the RF pulse signal 676 is less than the 50% duty cycle. As yet another example, the power amount P18 during a rise time of the RF pulse signal 678 is achieved later than the power amount P18 is achieved during a rise time of the RF pulse signal 676 and the power amount P18 during a fall time of the RF pulse signal 678 is achieved later than the power amount P18 is achieved during a fall time of the RF pulse time 676. As yet another example, the power amount P24 is achieved later during generation of the RF pulse signal 678 than a time at which the power amount P24 is achieved during generation of the RF pulse signal 676. The RF pulse signal 678 is used to generate the plot 636.

Moreover, the plot 674 is generated when an RF pulse signal 680 having a duty cycle is provided to the chuck 215. A duty cycle DC3 of the RF pulse signal 680 is greater than the duty cycle DC2 of the RF pulse signal 678. For example, a state S1 of the RF pulse signal 678 occurs for a shorter time period than a state S1 of the RF pulse signal 680 and a state S0 of the RF pulse signal 676 occurs for a longer time period than a state of the RF pulse signal 680. As another example, a duty cycle of the RF pulse signal 678 is 50% and a duty cycle of the RF pulse signal 680 is greater than the 50% duty cycle. As yet another example, the power amount P18 during a rise time of the RF pulse signal 678 is achieved earlier than the power amount P18 is achieved during a rise time of the RF pulse signal 680 and the power amount P18 during a fall time of the RF pulse signal 678 is achieved earlier than the power amount P18 is achieved during a fall time of the RF pulse time 680. As yet another example, the power amount P24 is achieved later during generation of the RF pulse signal 680 than a time at which the power amount P24 is achieved during generation of the RF pulse signal 678.

It should be noted that a number of low-energy ions that are generated when the RF pulse signal 678 is applied to the chuck 215 is greater than a number of low-energy ions that are generated when the RF pulse signal 676 is applied to the chuck 215 or when the RF pulse signal 680 is applied to the chuck 215. It should further be noted that shapes of the RF pulse signals 676, 678, and 680 are similar, e.g., sinusoidal, etc.

In some embodiments, a duty cycle of an RF pulse signal is optimized to generate a greater number of low-energy ions. For example, the duty cycle DC2 is between the duty cycles DC1 and DC3. A duty cycle of an RF pulse signal is optimized in a manner similar to that described above. For example, the IEMD provides an ion energy distribution to the processor 214, which determines from the ion energy distribution whether an amount of ion energy is less than a pre-determined threshold. Upon determining that the amount of ion energy is less than the pre-determined threshold, the processor 214 changes a duty cycle, e.g., from DC1 to DC2, from DC3 to DC2, etc., to decrease the amount of ion energy to further increase a number of low-energy ions within the plasma chamber 206. In some embodiments, the duty cycle is iteratively decreased until the amount of ion energy is determined to be less than the pre-determined threshold.

In various embodiments, a duty cycle of an RF pulse signal has a rise time, a steady state time period, a fall time, a shape, a power amount for the state S0, and a power amount for the state S1. Upon receiving or determining a power amount for the state S0, a power amount for the state S1, and a duty cycle of the clock signal, the processor 214 changes the rise time, the steady state time period, the fall time, and/or the shape to change a duty cycle of an RF pulse signal.

Figure 7:
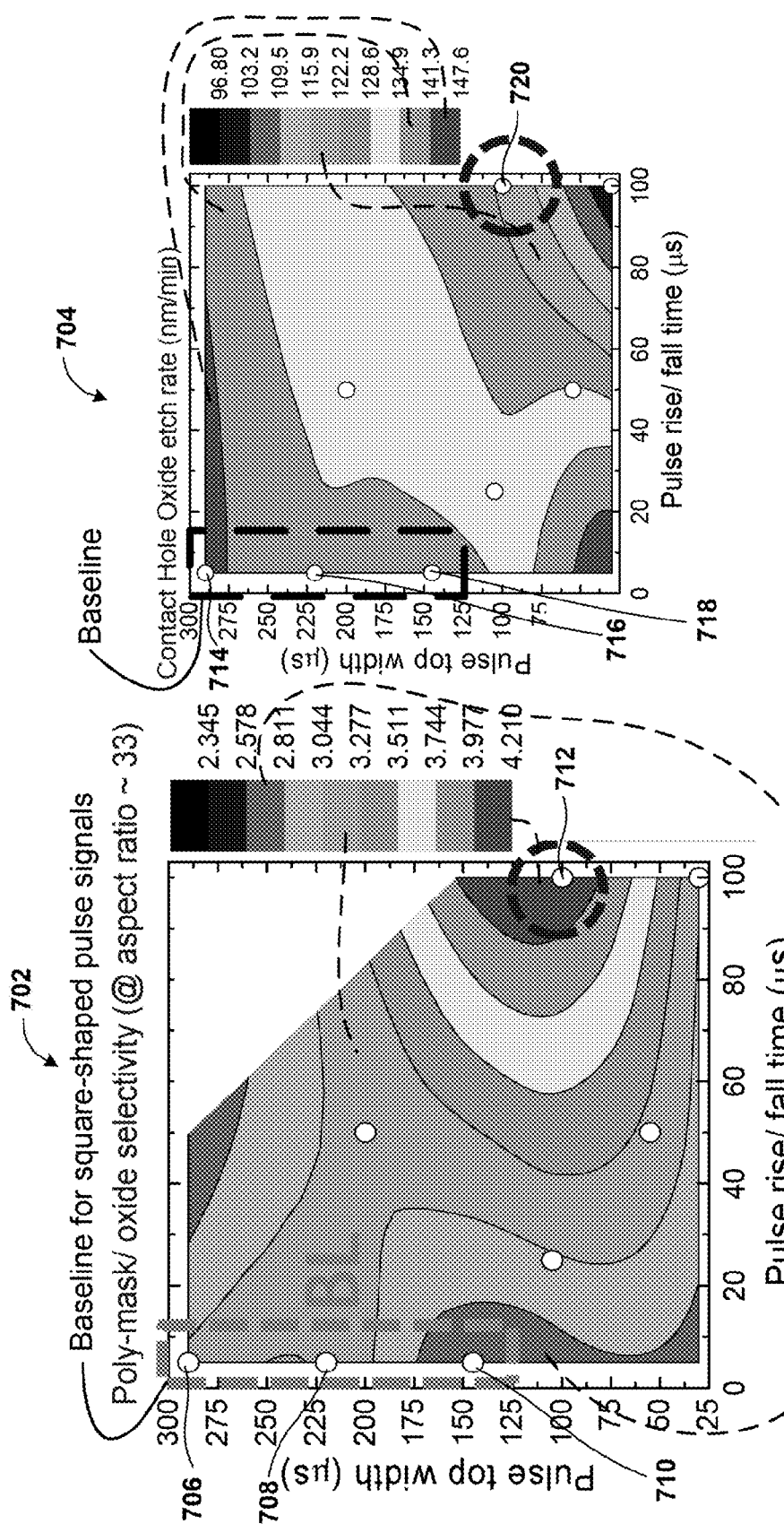
FIG. 7 is a graph to illustrate that with an increase in a pulse rise or fall time or with a decrease with a pulse top width, there is an increase in selectivity of the etch layer, in accordance with an embodiment described in the present disclosure.

FIG. 7 is an embodiment of a graph 702 to illustrate that with an increase in a pulse rise or fall time or with a decrease in a pulse top width, e.g., a steady state time period, a steady state, etc., there is an increase in selectivity of the etch layer. For example, a selectivity of the etch layer is lower when a square-shaped pulse is supplied to the chuck 215 (FIG. 2) compared to when an RF pulse signal that has a rise time or a fall time other than a substantial infinite slope is supplied to the chuck 215. The graph 702 plots a pulse top width of an RF pulse signal versus a pulse rise or a fall time of the RF pulse signal versus a selectivity of the oxide layer achieved with the RF pulse signal.

Points 706, 708, and 710 in the graph 702 relate to square-shaped RF pulse signals to form a baseline. Moreover, point 712 in the graph 702 relates to an RF pulse signal that has a rise transition slope and/or a fall transition slope other than a substantially infinite slope.

It should be noted that a square-shaped RF signal has a faster rise time than a rise time of an RF pulse signal having a rise transition slope other than a substantial infinite slope. It should further be noted that a square-shaped RF signal has a faster fall time than a fall time of an RF pulse signal having a fall transition slope other than a substantial infinite slope. Moreover, it should be noted that a pulse width during a steady state of the state S1 of a square-shaped RF pulse signal is greater than a pulse width during a steady state of the state S1 of an RF pulse signal that has a rise transition slope and/or a fall transition slope other than a substantial infinite slope.

In some embodiments, a selectivity is defined as a ratio of a rate of etching the etch layer to a rate of etching the mask layer.

FIG. 7 also shows an embodiment of a graph 704 to illustrate that a rate of etching the etch layer decreases minimally with a change in a pulse width, a rise transition time, and/or a fall transition time of an RF pulse signal. The rate of etching the etch layer is for a selective etching operation, e.g., etching to form the contact hole 102 (FIG. 1) and other similar contact holes within the etch layer, etc. The graph 704 plots a pulse top width during a steady state of the state S1 of an RF pulse signal versus a pulse rise time of the RF pulse signal and/or a pulse fall time of the RF pulse signal and versus a rate of etching the etch layer of the substrate stack 100 (FIG. 1). In some embodiments, a pulse rise time is an amount of time for an RF pulse to achieve a state S1 from a state S0 and a pulse fall time is an amount of time for an RF pulse to achieve a state S0 from a state S1.

Points 714, 716, and 718 in the graph 704 are shown as a baseline and are generated when a selective etching operation is performed using square-shaped pulse signals. Moreover, a point 720 in the graph 704 is generated when a selective etching operation is performed using an RF pulse signal that has a rise transition slope and/or a fall transition slope other than a substantially infinite slope.

It should be noted that an etch rate achieved using an RF pulse signal that has a rise transition slope and/or a fall transition slope other than a substantially infinite slope is not similar to, e.g., within a close range from, etc., an etch rate achieved using square-shaped pulse signals.

Figure 8:
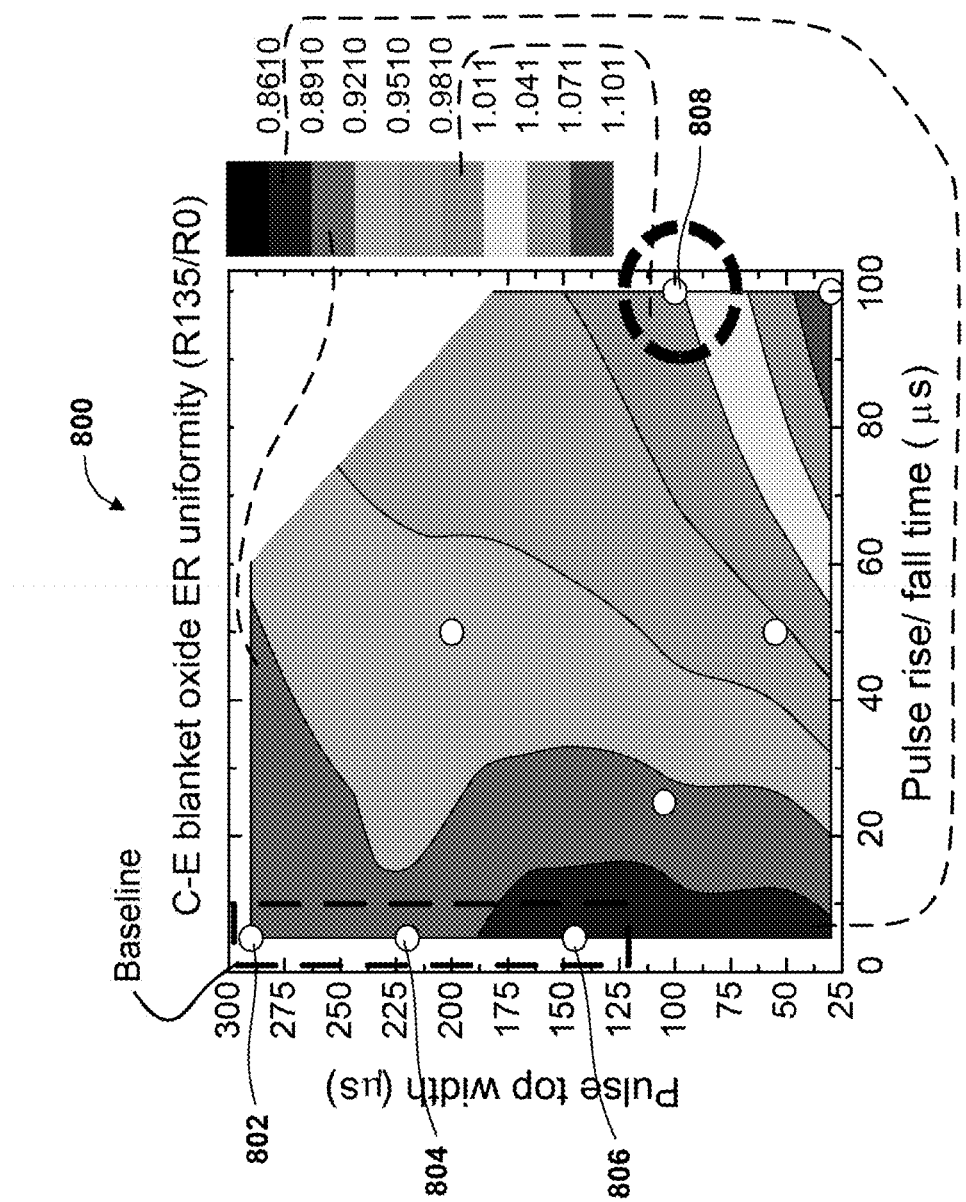
FIG. 8 is a graph to illustrate an improvement in etch rate uniformity across a surface of the substrate stack when an RF pulse signal that has a rise transition slope and/or a fall transition slope other than a substantially infinite slope is used for performing an etching operation, in accordance with an embodiment described in the present disclosure.

FIG. 8 is a graph 800 to illustrate an improvement in etch rate uniformity across a surface of the substrate stack 100 (FIG. 1) when an RF pulse signal that has a rise transition slope and/or a fall transition slope other than a substantially infinite slope is used for performing an etching operation. The graph 800 plots a pulse top width during a steady state of a state S1 of an RF pulse signal versus a rise time and/or a fall time versus a center-to-edge etch rate uniformity of the etch layer.

Points 802, 804, and 806 on the graph 800 form a baseline and are generated when square-shaped RF pulse signals are used to etch the etch layer. Moreover, a point 808 of the graph 800 is generated when an RF pulse signal that has a rise transition slope and/or a fall transition slope other than a substantially infinite slope is used to etch the etch layer. Also, the point 808 is generated when the RF pulse signal that has a lower pulse top width than that of a square-shaped pulse signal. As shown, an etch rate uniformity of contact holes on a surface of the substrate stack 100 is improved at the point 808 compared to etch rate uniformities associated with the point 802, 804, and 806.

Figure 9:
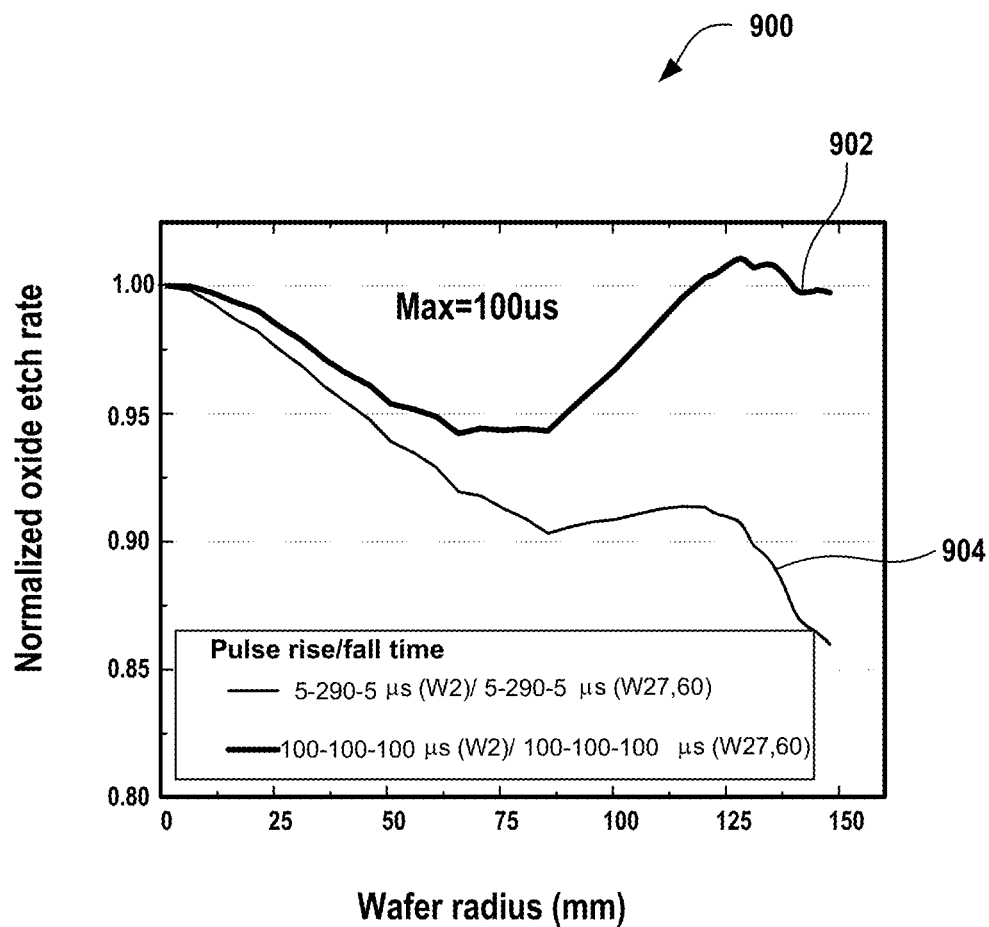
FIG. 9 is a plot to illustrate an improvement of normalized etch rate uniformity when low-energy ions are increased, in accordance with an embodiment described in the present disclosure.

FIG. 9 is an embodiment of a plot 900 to illustrate an improvement of normalized etch rate uniformity when low-energy ions are increased. The plot 900 plots a normalized rate of etching the etch layer versus a radius of the substrate stack 100 (FIG. 1). The plot 900 includes a graph 902 that shows a normalized etch rate across contact holes on the surface of the substrate stack 100 when an RF pulse signal that has a rise transition slope and/or a fall transition slope other than a substantially infinite slope is used. Moreover, the plot 900 includes a graph 904 that shows a normalized etch rate across contact holes on the surface of the substrate stack 100 when a square-shaped pulse signal is used. The graph 902 is more uniform than the graph 904.

Figure 10A:
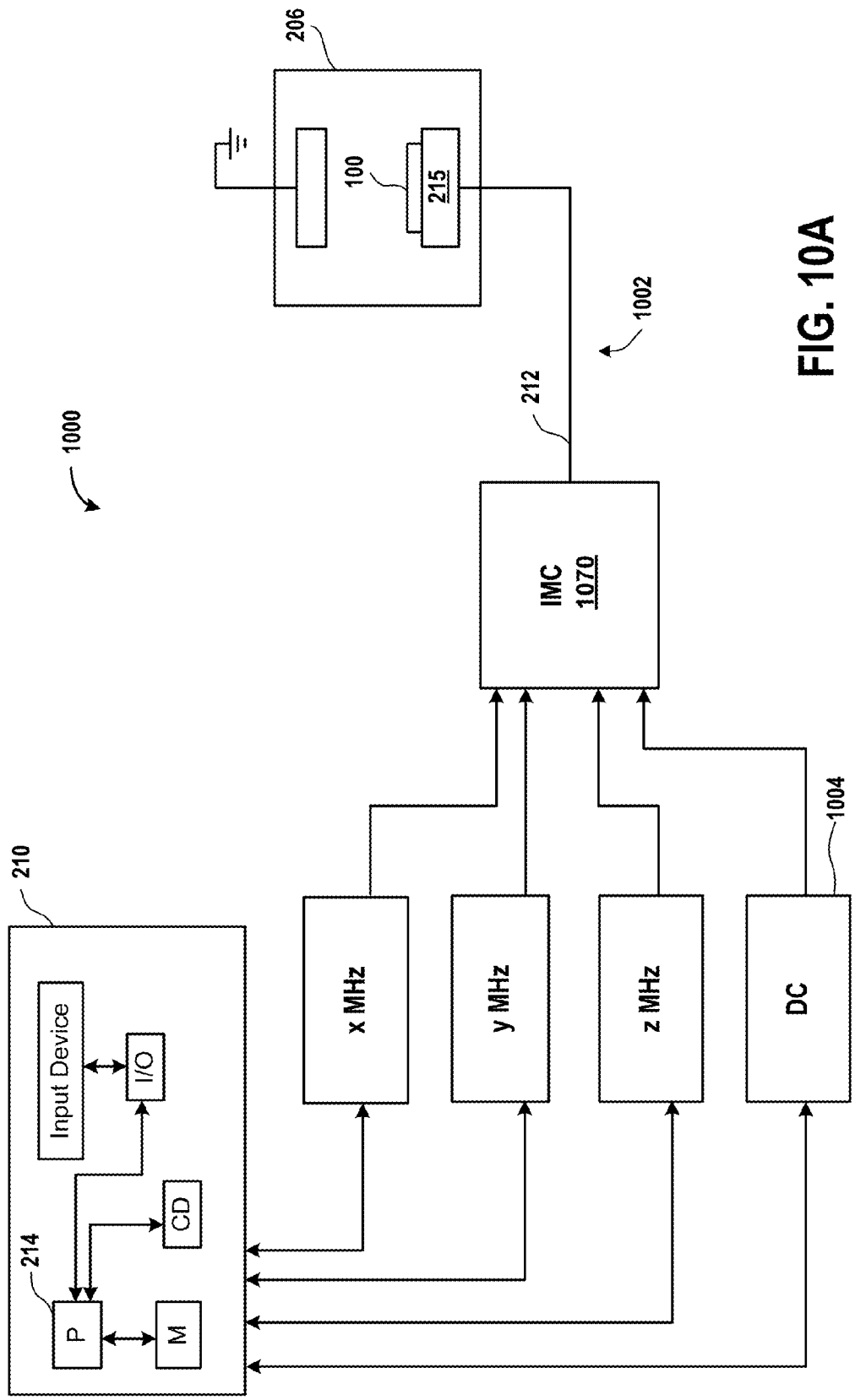
FIG. 10A is a diagram of a system for illustrating use of a direct current (DC) power supply to generate a modified RF pulse signal, in accordance with an embodiment described in the present disclosure.
Figure 10B:
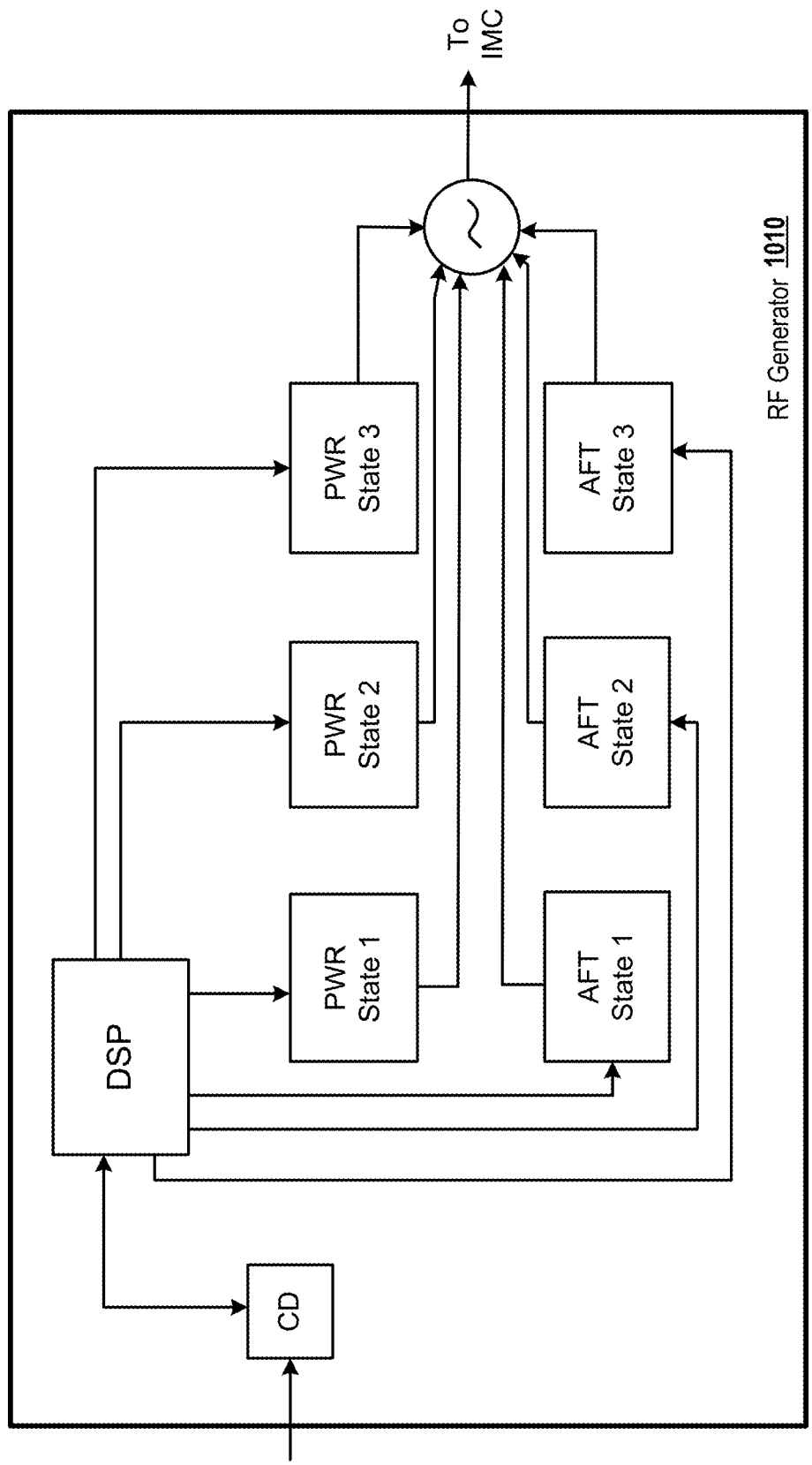
FIG. 10B is a diagram of an RF generator that operates in three states, in accordance with an embodiment described in the present disclosure.
Figure 10C:
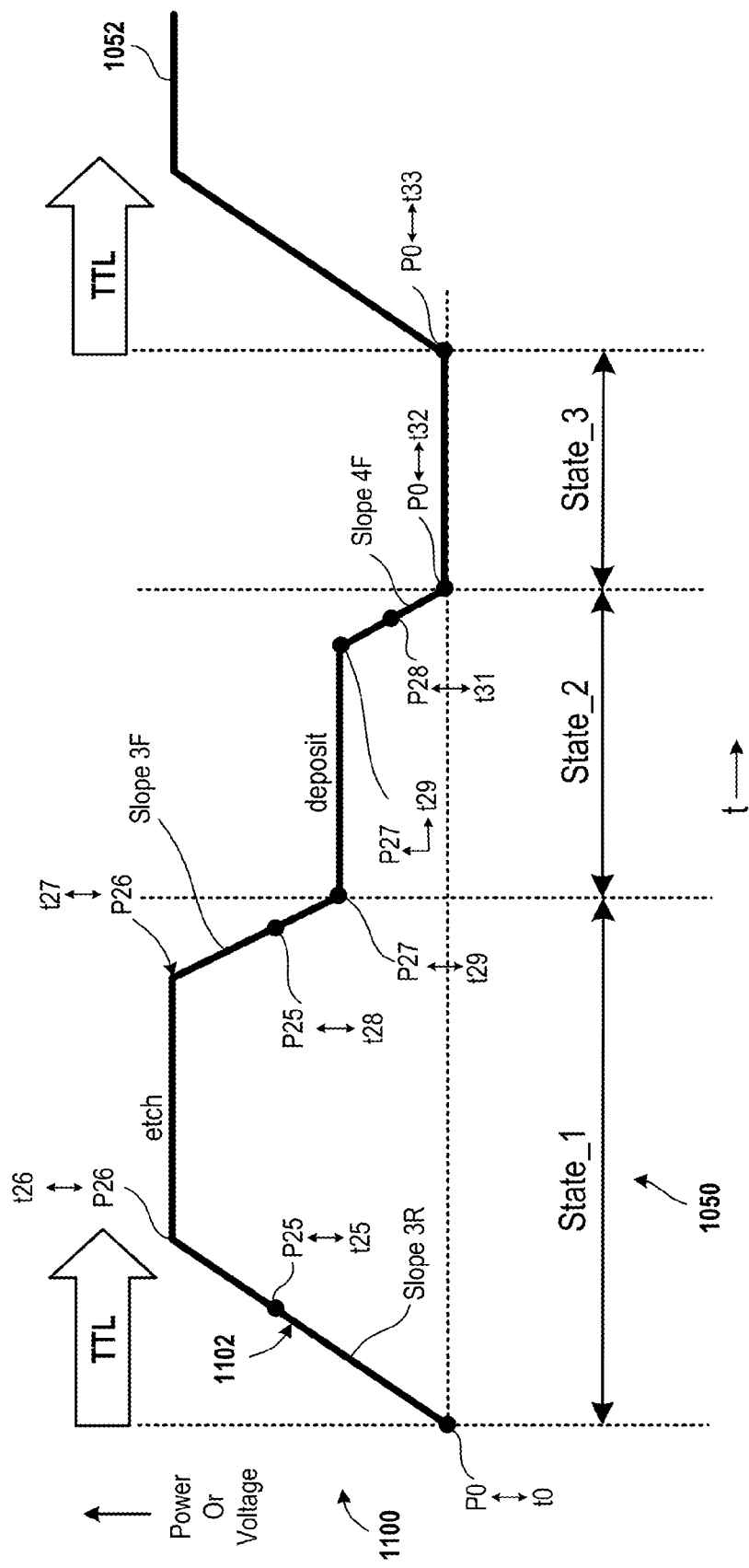
FIG. 10C is a graph to illustrate three states of an RF pulse signal, in accordance with an embodiment described in the present disclosure.

FIG. 10A is a diagram of an embodiment of a system 1000 for illustrating use of a direct current (DC) power supply 1004 to generate a modified RF pulse signal 1002. FIG. 10B is a diagram of an embodiment of an RF generator 1010 that operates in three states. FIG. 10C is an embodiment of a graph 1050 to illustrate three states of an RF pulse signal 1052. The graph 1050 plots power of an RF pulse signal versus time t.

The system 1000 is similar to the system 200 of FIG. 2 except that the system 1000 includes the DC power supply 1004, which is connected to the host system 210, and the x, y, and z MHz RF generators of the system 1000 operate in three states, e.g., a state 1, a state 2, and a state 3, etc., of an RF pulse signal. Moreover, the IMC 204 is replaced with an IMC 1070. The IMC 1070 is connected to the x, y, and z MHz RF generators of the plasma system 1000 and to the DC power supply 1004.

The DC power supply 1004 supplies power of fixed polarity to the lower electrode. In some embodiments, the DC power supply 1004 is programmable via a communication device, e.g., a communication device that applies a serial communication protocol, a communication device that applies a parallel communication protocol, a communication device that applies an RS-232 communication protocol, a communication device that applies a general purpose interface bus (GPIB) communication protocol, etc.

The RF generator 1010 is similar to the RF generator 302 of FIG. 3A except that the RF generator 1010 operates in three states instead of two. The RF generator 1010 includes a DSP, multiple power controllers PWRState1, PWRState2, and PWRState3, one for each state, and multiple AFTs, which include AFTState1, AFTState2, and AFTState3.

With reference to FIGS. 10A and 10C, the processor 214 receives a rise transition slope SLOPE3R for the state 1 of the RF pulse signal 1052, a fall transition slope SLOPE3F for the state 1, and a fall transition slope SLOPE4F for the state 2 of the RF pulse signal 1052 from the user via the input device. The processor 214 receives power amounts for steady states associated with the states 1, 2, and 3. The processor 214 determines power amounts associated with the slope SLOPE3R and timings associated with the power amounts based on the slope SLOPE3R, the power amounts for the steady states associated with the state 3 and state 1, and a cycle of a control signal having three states. For example, the processor 214 determines a power amount P25 to be achieved at a time t25 and further determines a power amount P26 to be achieved at a time t26 for achieving the slope SLOPE3R. The processor 214 determines that the power amount P25 is to be achieved from the power amount P0 at the time t0. The power amount P0 is of a steady state of the state 3 and the power amount P26 is of the steady state of the state 1. The times t25 and t26 are determined based on the slope SLOPE3R and the cycle of the control signal, e.g., time period designated for the state 1, etc. Moreover, the processor 214 determines power amounts associated with the slope SLOPE3F and timings associated with the power amounts based on the slope SLOPE3F, the power amounts for the steady states associated with the state 1 and state 2, and the cycle of the control signal having three states. For example, the processor 214 determines the power amount P25 to be achieved at a time t28 from the power amount P26 achieved at a time t26, and the processor 214 calculates a power amount P27 to be achieved at a time t29. The power amount P27 is of a steady state of the state 2 and the power amount P26 is of the steady state of the state 1. The times t26, t27, and t28 are determined based on the slope SLOPE3F and the cycle of the control signal.

The processor 214 determines that the power amount P26 be maintained for a time period between the times t26 and t27. The time period is a remaining time period during a first one of three states, e.g., a state corresponding to the state 1, etc., of the control signal. The three states of the control signal are further described below.

Moreover, the processor 214 determines power amounts and timings associated with the fall transition slope SLOPE4F of the state 2 based on the slope SLOPE4F, the power amounts for the steady states associated with the state 2 and state 1, and the cycle of the control signal having three states. For example, the processor 214 determines a power amount P28 to be achieved at a time t31 from the power amount P27 achieved at a time t30, and the power amount P0 to be achieved at a time t32 based on the slope SLOPE4F, the power amount P27 of a steady state of the state 2, the power amount P0 of a steady state of the state 3, and a time period of the cycle of the control signal. The time period of the cycle of the control signal is a time period of a state associated with the state 2. Furthermore, the processor 214 determines that the state 3 has the power amount P30 for a time period, e.g., from the time t32 to a time t33, etc. The time period is a remaining time period during a third one of three states of the control signal.

The control signal having the three states provides a number of states to the processor 214. For example, the processor 214 determines that an RF pulse signal having the three states is to be generated in synchronization with the three states of the control signal. To further illustrate, the processor 214 determines that the RF pulse signal initiates a transition for achieving the state 1 when the control signal achieves the state 1, that the RF pulse signal initiates a transition for achieving the state 2 when the control signal achieves the state 2, and that the RF pulse signal initiates a transition for achieving the state 3 when the control signal achieves the state 3.

In various embodiments, the power amounts P0, P25, P26, P27, and P28, and the timings t0, t25, t26, t27, t28, t29, t30, t31, t32, and t33 are received by the processor 214 from the user via the input device instead of being generated by the processor 214.

It should be noted that the time t33 is greater than the time t32, which is greater than the time t31. Moreover, the time t31 is greater than the time t30 and the time t30 is greater than the time t29. The time t29 is greater than the time t28, which is greater than the time t27. The time t27 is greater than the time t26, which is greater than the time t25. The time t25 is greater than the time t0.

With reference to FIG. 10A, the processor 214 provides the power amounts P0, P25, P26, P27, and P28 and the timings t0, t25, t26, t27, t28, t29, t30, t31, t32, and t33 associated with the three states state 1, state 2, and state 3 of the RF pulse signal 1052 via the communication device of the host system 210 and the communication device of the RF generator 1010 to a DSP of the RF generator 1010. The DSP of the RF generator 1010 performs an operation similar to that of the DSP of the RF generator 302. For example, the DSP of the RF generator 1010 identifies power amounts and timings associated with the state 1, identifies power amounts and timings associated with the state 2, and identifies power levels and timings associated with the state 3 from power amounts and timing received from the processor 214.

The DSP of the RF generator 1010 provides the power amounts P0, P25, P26, and P27 and the timings t0, t25, t26, t27, t28, and t29 to the power controller PWRState1. Moreover, the DSP of the RF generator 1010 provides the power amounts P27, P28, and P0 and the timings t29, t30, and t31 to the power controller PWRState2. The DSP of the RF generator 1010 further provides the power amount P0, and the timings t32 and t33 to the power controller PWRState3.

The power controller PWRState1 drives during the state 1, an RF power supply of the RF generator 1010 to enable the RF power supply to generate a portion of the RF pulse signal 1052 for the state 1. Similarly, the power controller PWRState2 drives during the state 2, the RF power supply of the RF generator 1010 to enable the RF power supply to generate a portion of the RF pulse signal 1052 for the state 2. Moreover, the power controller PWRState3 drives during the state 3, an RF power supply of the RF generator 1010 to enable the RF power supply to generate a portion of the RF pulse signal 1052 for the state 3. The RF power supply of the RF generator 1010 generates the RF pulse signal 1052.

Similarly, the y and z MHz RF generators of the plasma system 1000 generate RF pulse signals. For example, the y or z MHz RF generator generates an RF pulse signal that has a different rise transition slope than a rise transition slope of an RF pulse signal that is generated by the x MHz RF generator. As another example, the y or z MHz RF generator generates an RF pulse signal that has a different fall transition slope than a fall transition slope of an RF pulse signal that is generated by the x MHz RF generator. As yet another example, the y or z MHz RF generator generates an RF pulse signal that has the same rise transition slope as that of an RF pulse signal that is generated by the x MHz RF generator. As yet another example, the y or z MHz RF generator generates an RF pulse signal that has the same fall transition slope as that of an RF pulse signal that is generated by the x MHz RF generator.

The IMC 1070 receives RF pulse signals via corresponding RF cables from the x, y, and z MHz RF generators of the plasma system 1000, and combines the RF pulse signals to generate the modified RF pulse signal 1002. While combining the RF pulse signals, the IMC 1070 matches an impedance of the load connected to an output of the IMC 1070 with that of a source that is connected to inputs of the IMC 1070. Examples of the source that is connected to the input of the IMC 1070 includes the x, y, and z MHz RF generators of the plasma system 1000. The modified RF pulse signal 1002 is provided via the RF transmission line 212 to the chuck 215 to generate or sustain plasma within the plasma chamber 206.

In various embodiments, one or more of the slopes 3F, 3R, and 4F are curved, e.g., exponential, sinusoidal, bell-shaped, etc. In some embodiments, the slope 4F is different from the slope 3F. For example, the slope 4F is curved and the slope 3F is straight. As another example, the slope 4F has a different transition time than the slope 3F.

In several embodiments, the slope 3F has a different slope than that of the slope 3R. For example, the slope 3F has a higher or a lower transition time than the slope 3R.

In some embodiments, each slope 3R, 3F, and 4F is other than a substantial infinite slope.

In various embodiments, the power amount P0 is zero. The zero amount of power turns off plasma within the plasma chamber 206 when the power amount P0 is generated by the x MHz RF generator. In several embodiments, the power amount P0 is a positive amount of power.

In some embodiments, the control signal that is received by the processor 214 is from a control circuit, e.g., a combination of a clock source, a signal generator, and a combiner, etc. A clock signal of the clock source is combined, e.g., added, etc., with a signal from the signal generator to generate the control signal having three states.

In various embodiments, high-energy ions are generated during a steady state of each of the states state 1 and state 2, and low-energy ions are generated during a time period remaining during the state 1 and low-energy ions are generated during a time period remaining during the state 2.

Figure 10D:
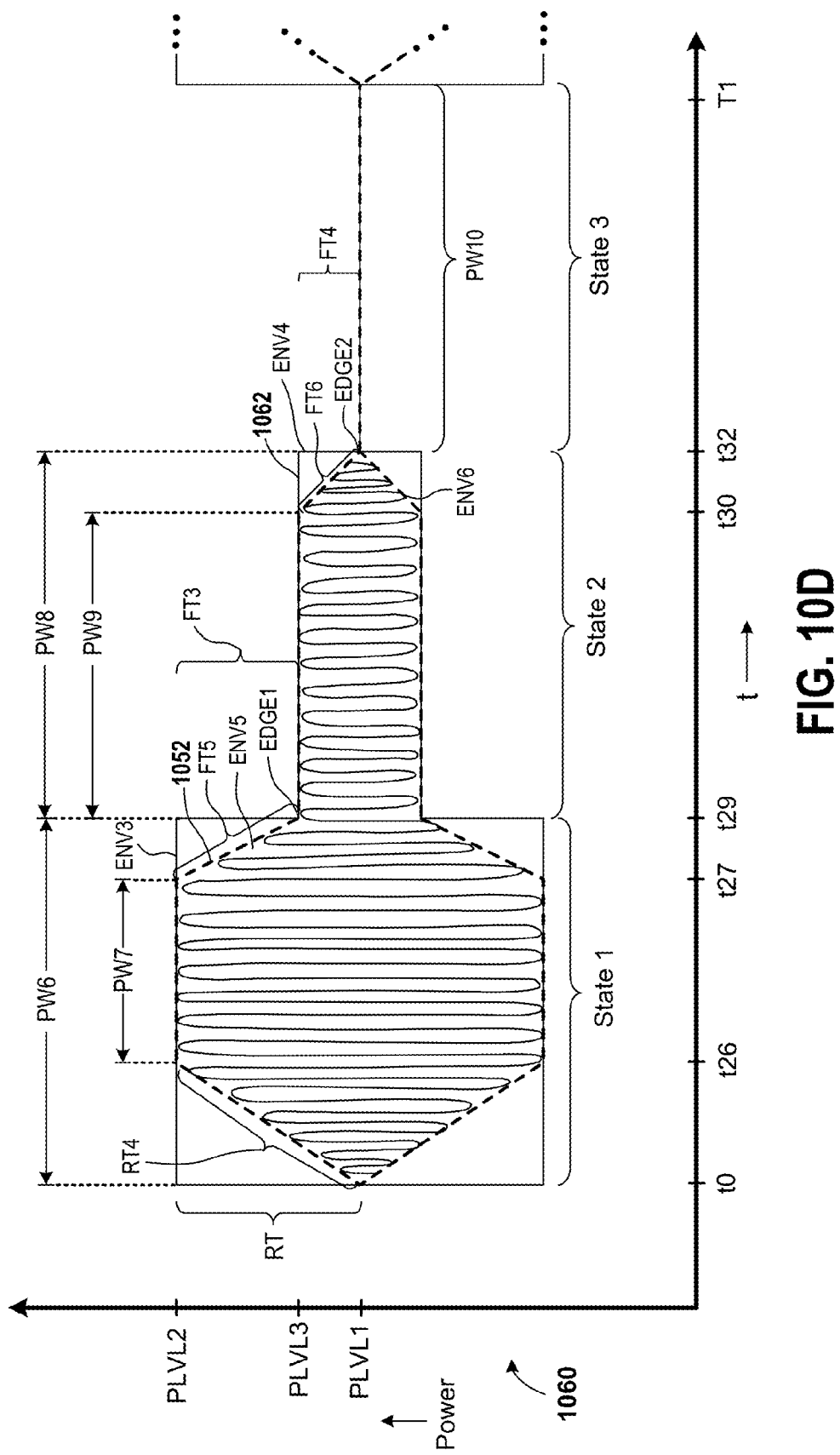
FIG. 10D is a graph to illustrate use of three states to generate an RF pulse signal from a square-shaped RF pulse signal, in accordance with an embodiment described in the present disclosure.

FIG. 10D is an embodiment of a graph 1060 to illustrate use of the three states to generate the RF pulse signal 1052 from a square-shaped RF pulse signal 1062. The processor 214 (FIG. 2) sets, e.g., identifies, determines, etc., a pulsing frequency of the square-shaped RF pulse signal 1062 or the RF pulse signal 1052, which is the same as that of the control signal. The pulsing frequency of the square-shaped RF pulse signal 1062 switches between the high power level PLVL2, a medium power level PLVL3, and the low power level PLVL1. The medium power level PLVL3 includes power amounts that are between the high power level PLVL2 and the low power level PLVL1. The high power level PLVL2 is defined between an envelope ENV3 having a rise transition RT3 and a fall transition FT3. The envelope ENV3 is of an RF sinusoidal signal and forms a part of the square-shaped RF pulse signal 1062 during the state 1. Moreover, the medium power level PLVL3 is defined between an envelope ENV4 that starts from an edge EDGE1 of the fall transition FT3 and extends until an edge EDGE 2 of a fall transition FT4. The envelope ENV4 is of an RF sinusoidal signal and forms a part of the square-shaped RF pulse signal 1062 during the state 2.

In some embodiments, the processor 214 receives the pulsing frequency of the square-shaped RF pulse signal 1062 or of the RF pulse signal 1052 from the user via the input device. For example, the user selects an icon or a symbol on a graphical user interface displayed on the display device of the host system 210 via the input device to provide a signal indicating the pulsing frequency of the square-shaped RF pulse signal 1062 or of the RF pulse signal 1052.

The processor 214 sets, e.g., identifies, determines, etc., a slope parameter for modifying the square-shaped RF pulse signal 1062, e.g., a parameter to determine a change in an angle of the square-shaped pulse signal 1062, a parameter for determining a decrease in an angle of a rise transition or a fall transition of the square-shaped pulse signal 1062, etc. The slope parameter is set for each of the rise transition RT3, the fall transition FT3, and/or the fall transition FT4. The slope parameter defines a reduction in a rate of rise for the rise transition RT3, a reduction in a rate of fall for the fall transition RT3, and/or a reduction in a rate of fall for the fall transition FT4. For example, a slope parameter increases a rise time to achieve a rise transition RT4 from the rise transition RT3, another slope parameter increases a fall time to achieve a fall transition FT5 from the fall transition FT3, and/or another slope parameter increases a fall time to achieve a fall transition FT6 from the fall transition FT4. The rise transition RT4 is from the low power level PLVL1 to the high power level PLVL2. The fall transition FT5 is a transition from the high power level PLVL2 to the medium power level PLVL3. Moreover, the fall transition FT5 is a transition from the medium power level PLVL3 to the low power level PLVL1. The reduction of the rate of rise to achieve the rise transition RT4 reduces a pulse width PW6 of an envelope ENV3 at the high power level PLVL2 to a pulse width PW7 of the envelope ENV5 at the high power level PLVL2. The envelope ENV5 is of a sinusoidal signal and forms a part of the RF pulse signal 1052 during the state 1. Moreover, the reduction of the rate of fall to achieve the fall transition FT5 reduces the pulse width PW6 of the envelope ENV3 at the high power level PLVL2 to the pulse width PW7 of an envelope ENV5 at the high power level PLVL2. Also, the reduction of the rate of fall to achieve the fall transition FT6 reduces a pulse width PW8 of the envelope ENV4 at the medium power level PLVL3 to a pulse width PW9 of an envelope ENV6 of the RF pulse signal 1052 at the medium power level PLVL3. Each of the high power level PLVL2 and the medium power level PLVL3 has a shorter duration, e.g., a shorter pulse width, etc., than a time for a pulse width PW10 of the low power level PLVL1. The envelope ENV6 is of a sinusoidal signal and forms a part of the RF pulse signal 1052 during the state 2.

In some embodiments, a slope parameter associated with the RF pulse signal 1052 is received in the form of a signal via the input device for setting by the processor 214. For example, the user selects an icon or a symbol on a graphical user interface displayed on the display device of the host system 210 via the input device to provide the signal indicating the slope parameter associated with the RF pulse signal 1052.

The RF pulse signal 1052 is supplied to the lower electrode of the plasma system 200 (FIG. 2). An increase in low energy ions occurs during the rise transition RT4, the fall transition FT4, and the fall transition FT5. Moreover, high ion energy is produced during the reduced pulse width PW7 of envelope ENV5 at the high power level PLVL2 and during the reduced pulse width PW9 of the envelope ENV6 at the medium power level PLVL3.

Figure 12:
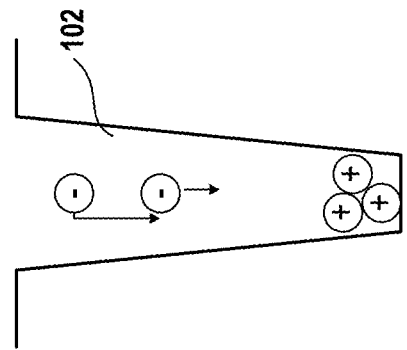
FIG. 12 is a diagram of a contact hole to illustrate use of the DC power supply to increase an etch rate, in accordance with an embodiment described in the present disclosure.
Figure 11:
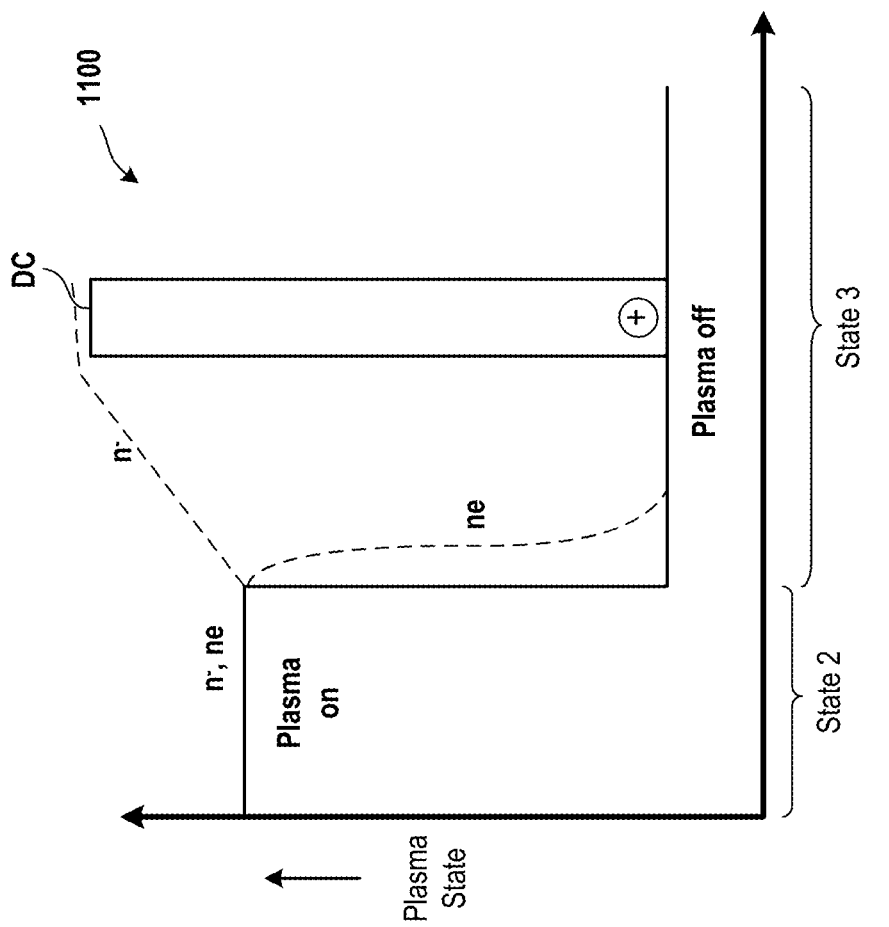
FIG. 11 is a graph to illustrate application of direct current (DC) power during a state 3 to increase an etch rate during an etching operation, in accordance with an embodiment described in the present disclosure.

FIG. 11 is an embodiment of a graph 1100 to illustrate application of DC power during the state 3 to increase an etch rate and/or an etch rate uniformity during an etching operation. FIG. 12 is a diagram of an embodiment of the contact hole 102. The graph 1100 plots a plasma state versus a time t. During the state 3, plasma within the plasma chamber 206 is turned off, e.g., is not being generated, etc. When the plasma is turned off, e.g., during the state 3 of the RF pulse signal 1052 (FIG. 10C), etc., the DC power supply 1004 (FIG. 10A) is controlled by the processor 214 (FIG. 10A) via the communication device of the host system 210 (FIG. 10A) and a communication device of the DC power supply 1004 to generate an amount of DC power. In some embodiments, plasma is not turned off during the state 3 of the RF pulse signal 1052.

The DC power is provided to the IMC 1070 (FIG. 10A), which matches an impedance of the load connected to the IMC 1070 with an impedance of a source connected to the IMC 1070. Examples of the source connected to the IMC 1070 include the DC power supply 1040 and a cable that connects the DC power supply 1040 to the IMC 1070. The DC power is provided via the RF transmission line 212 to the chuck 215 to generate ions within the plasma chamber 206.

The negative ions generated within the plasma chamber 206 during the state 2 (FIG. 11) accelerate towards the substrate stack 100 by application, during plasma afterglow in state 3 (FIG. 11), of positive DC power to the substrate stack 100. The positive DC power is applied by the DC power supply 1040. The negative ion flux created by the accelerated negative ions neutralizes positive charge accumulated at the bottom of the contact hole 102 (FIG. 12). Therefore, etch rate of the bottom of the contact hole 102 by positive ions during following states 1 and 2 is increased.

It should be noted that although the above-described embodiments relate to providing an RF signal to the lower electrode of the chuck 215 and grounding the upper electrode, in several embodiments, the RF signal is provided to the upper electrode while the lower electrode of the chuck 215 is grounded.

In one aspect, some of the embodiments, described herein, are practiced with various computer system configurations including hand-held hardware units, microprocessor systems, microprocessor-based or programmable consumer electronics, minicomputers, mainframe computers, etc. In an aspect, some of the embodiments, described herein, are practiced in distributed computing environments where tasks are performed by remote processing hardware units that are linked through a computer network.

In various embodiments, a controller is part of a system. The system includes semiconductor processing equipment, including a processing tool or tools, chamber or chambers, a platform or platforms for processing, and/or specific processing components (a wafer pedestal, a gas flow system, etc.). The system is integrated with electronics for controlling its operation before, during, and after processing of a semiconductor wafer or substrate. The electronics is referred to as the "controller," which controls various components or subparts of the system. The controller, depending on processing requirements and/or a type of the system, is programmed to control any process disclosed herein, using a recipe, which includes a process gases, temperature settings (e.g., heating and/or cooling), pressure settings, vacuum settings, power settings, RF generator settings, RF matching circuit settings, frequency settings, flow rate settings, fluid delivery settings, positional and operation settings, wafer transfers into and out of a tool and other transfer tools and/or load locks connected to or interfaced with the system.

Broadly speaking, in a variety of embodiments, the controller is defined as electronics having various integrated circuits, logic, memory, and/or software that receive instructions, issue instructions, control operation, enable cleaning operations, enable endpoint measurements, and the like. The integrated circuits include chips in the form of firmware that store program instructions, DSPs, chips defined as ASICs, PLDs, one or more microprocessors, or microcontrollers that execute program instructions (e.g., software). The program instructions are instructions communicated to the controller in the form of various individual settings (or program files), defining operational parameters for carrying out a process on or for a semiconductor wafer. The operational parameters are, in some embodiments, a part of a recipe defined by process engineers to accomplish one or more processing steps during the fabrication of one or more layers, materials, metals, oxides, silicon, silicon dioxide, surfaces, circuits, and/or dies of a wafer.

The controller, in some embodiments, is a part of or coupled to a computer that is integrated with the system, or coupled to the system, or otherwise networked to the system, or a combination thereof. For example, the controller is in a "cloud" or all or a part of a fab host computer system, which allows for remote access for wafer processing. The controller enables remote access to the system to monitor current progress of fabrication operations, examines a history of past fabrication operations, examines trends or performance metrics from a plurality of fabrication operations, to change parameters of current processing, to set processing steps to follow a current processing, or to start a new process.

In some embodiments, a remote computer (e.g. a server) provides process recipes to the system over a computer network, which includes a local network or the Internet. The remote computer includes a user interface that enables entry or programming of parameters and/or settings, which are then communicated to the system from the remote computer. In various embodiments, the controller receives instructions in the form of settings for processing a wafer. It should be understood that the settings are specific to a type of process to be performed on a wafer and a type of tool that the controller interfaces with or controls. Thus as described above, the controller is distributed, such as by including one or more discrete controllers that are networked together and working towards a common purpose, such as the fulfilling processes described herein. An example of a distributed controller for such purposes includes one or more integrated circuits on a chamber in communication with one or more integrated circuits located remotely (such as at a platform level or as part of a remote computer) that combine to control a process in a chamber.

Without limitation, in various embodiments, the system includes a plasma etch chamber, a deposition chamber, a spin-rinse chamber, a metal plating chamber, a clean chamber, a bevel edge etch chamber, a physical vapor deposition (PVD) chamber, a chemical vapor deposition (CVD) chamber, an atomic layer deposition (ALD) chamber, an atomic layer etch (ALE) chamber, an ion implantation chamber, a track chamber, and/or any other semiconductor processing chamber that is associated or used in fabrication and/or manufacturing of semiconductor wafers.

It is further noted that although the above-described operations are described with reference to a parallel plate plasma chamber, e.g., a capacitively coupled plasma chamber, etc., in some embodiments, the above-described operations apply to other types of plasma chambers, e.g., a plasma chamber including an inductively coupled plasma (ICP) reactor, a transformer coupled plasma (TCP) reactor, conductor tools, dielectric tools, a plasma chamber including an electron cyclotron resonance (ECR) reactor, etc. For example, an x MHz RF generator, a y MHz RF generator, and a z MHz RF generator are coupled to the ESC within the ICP plasma chamber.

As noted above, depending on a process operation to be performed by the tool, the controller communicates with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

With the above embodiments in mind, it should be understood that some of the embodiments employ various computer-implemented operations involving data stored in computer systems. These computer-implemented operations are those that manipulate physical quantities.

Some of the embodiments also relate to a hardware unit or an apparatus for performing these operations. The apparatus is specially constructed for a special purpose computer. When defined as a special purpose computer, the computer performs other processing, program execution or routines that are not part of the special purpose, while still being capable of operating for the special purpose.

In some embodiments, the operations, described herein, are performed by a computer selectively activated, or are configured by one or more computer programs stored in a computer memory, or are obtained over a computer network. When data is obtained over the computer network, the data may be processed by other computers on the computer network, e.g., a cloud of computing resources.

One or more embodiments, described herein, can also be fabricated as computer-readable code on a non-transitory computer-readable medium. The non-transitory computer-readable medium is any data storage hardware unit, e.g., a memory device, etc., that stores data, which is thereafter read by a computer system. Examples of the non-transitory computer-readable medium include hard drives, network attached storage (NAS), ROM, RAM, compact disc-ROMs (CD-ROMs), CD-recordables (CD-Rs), CD-rewritables (CD-RWs), magnetic tapes and other optical and non-optical data storage hardware units. In some embodiments, the non-transitory computer-readable medium includes a computer-readable tangible medium distributed over a network-coupled computer system so that the computer-readable code is stored and executed in a distributed fashion.

Although some method operations, described above, were presented in a specific order, it should be understood that in various embodiments, other housekeeping operations are performed in between the method operations, or the method operations are adjusted so that they occur at slightly different times, or are distributed in a system which allows the occurrence of the method operations at various intervals, or are performed in a different order than that described above.

It should further be noted that in an embodiment, one or more features from any embodiment described above are combined with one or more features of any other embodiment without departing from a scope described in various embodiments described in the present disclosure.

Although the foregoing embodiments have been described in some detail for purposes of clarity of understanding, it will be apparent that certain changes and modifications can be practiced within the scope of appended claims. Accordingly, the present embodiments are to be considered as illustrative and not restrictive, and the embodiments are not to be limited to the details given herein, but may be modified within the scope and equivalents of the appended claims.

The invention claimed is:

1. A method for setting operational parameters of a plasma processing system used for etching a substrate layer when placed on an electrode of the plasma processing system, comprising:
   receiving measured ion energy of ions within a plasma chamber;
   setting a pulsing frequency of a radio frequency (RF) generator, the RF generator producing an RF pulse signal having the pulsing frequency, the pulsing frequency switching between a low power level and a high power level, wherein the high power level is defined between an envelope having a rise transition and a fall transition;
   setting a slope parameter for modifying the RF pulse signal based on the measured ion energy, the slope parameter being set for each of the rise transition and fall transition of the envelope, the slope parameter defining a reduction in a rate of rise for the rise transition and a reduction in a rate of fall for the fall transition, wherein the reduction of the rate of rise and rate of fall shapes a reduced pulse width of the envelope at the high power level, wherein the high power level has a shorter duration than the low power level during the pulsing frequency; and
   supplying the RF pulse signal modified by the slope parameter to the electrode of the plasma processing system, wherein an increase in low energy ions occurs during the rise transition and the fall transition when the RF pulse signal is modified by the slope parameter, and high ion energy is produced during the reduced pulse width of the envelope, wherein the low energy ions have a lower energy than high energy ions having the high ion energy.

2. The method of claim 1, further comprising setting a shape of the RF pulse signal, the shape associated with the rise transition or the fall transition.

3. The method of claim 1, wherein the pulsing frequency is a frequency at which the envelope is pulsed between the high power level and the low power level.

4. The method of claim 1, wherein the RF pulse signal has a radio frequency and the radio frequency is different from the pulsing frequency.

5. The method of claim 1, wherein the low power level has power amounts that are lower than power amounts of the high power level.

6. The method of claim 1, wherein the envelope is an amplitude of the RF pulse signal.

7. The method of claim 1, wherein the rise transition is a transition from the low power level to the high power level.

8. The method of claim 1, wherein the fall transition is a transition from the high power level to the low power level.

9. The method of claim 1, wherein the slope parameter provides an angle of the RF pulse signal during the rise time.

10. The method of claim 1, wherein the slope parameter provides an angle of the RF pulse signal during the fall time.

11. The method of claim 1, wherein the RF pulse signal is modified to be other than a square-shaped pulse signal.

12. The method of claim 1, wherein the reduction in the rate of rise increases a rise time for the rise transition, the rise time being for transitioning from the low power level to the high power level.

13. The method of claim 1, wherein the reduction in the rate of fall decreases a fall time for the rise transition, the fall time being for transitioning from the high power level to the low power level.

14. The method of claim 1, wherein the reduced pulse width of the envelope is reduced compared to a pulse width of a square-shaped pulse signal.

15. The method of claim 1, wherein the shorter duration is shorter than a pulse width duration of a square-shaped pulse signal.

16. The method of claim 1, wherein supplying the RF pulse signal modified by the slope parameter includes supplying via an RF cable, an impedance matching circuit, and an RF transmission line the RF pulse signal that is modified to the electrode, wherein the RF generator is coupled to the impedance matching circuit via the RF cable, wherein the plasma chamber is connected to the impedance matching circuit via the RF transmission line.

17. The method of claim 1, further comprising optimizing a duty cycle of the RF pulse signal to increase an amount of the low-energy ions.

18. The method of claim 1, wherein the slope parameter and the reduced pulse width increases a selectivity associated with an oxide layer of the substrate layer compared to a selectivity associated with a square RF pulse, wherein the slope parameter and the reduced pulse width increases an etch rate uniformity associated with a selective etch compared to an etch rate uniformity associated with the square RF pulse.

19. A method for setting operational parameters of a plasma processing system used for etching a substrate layer when placed on an electrode of the plasma processing system, comprising:
   receiving measured ion energy of ions within a plasma chamber;
   setting a pulsing frequency of a radio frequency (RF) generator, the RF generator producing an RF pulse signal having the pulsing frequency, the pulsing frequency switching among a low power level, a medium power level, and a high power level, wherein the high power level is defined between an envelope having a rise transition and a first fall transition, wherein the medium power level is defined between an envelope that starts from an edge of the first fall transition until an edge of a second fall transition;

setting a slope parameter for modifying the RF pulse signal based on the measured ion energy, the slope parameter being set for each of the rise transition, the first fall transition, and the second fall transition, the slope parameter defining a reduction in a rate of rise for the rise transition, a reduction in a rate of fall for the first fall transition, and a reduction in a rate of fall for the second fall transition, wherein the reduction of the rate of rise and the rate of fall for the first transition shapes a reduced pulse width of the envelope at the high power level, wherein the reduction of the rate of fall for the second transition shapes a reduced pulse width of the envelope at the medium power level, wherein each of the high power level and the medium power level has a shorter duration than the low power level during the pulsing frequency; and supplying the RF pulse signal modified by the slope parameter to the electrode of the plasma processing system, wherein an increase in low energy ions occurs during the rise transition, the first fall transition, and the second fall transition when the RF pulse signal is modified by the slope parameter, and high ion energy is produced during the reduced pulse width of the envelopes at the high and medium power levels, wherein the low energy ions have a lower energy than high energy ions having the high ion energy.

20. The method of claim 19, further comprising controlling a direct current (DC) power supply to supply power during the low power level to generate ions having a charge opposite to a charge associated with the etching of the substrate layer, the ions generated to reduce the charge associated with the etching of the substrate layer.

21. The method of claim 19, wherein the medium power level is between the high power level and the low power level.

* * * * *